US011955502B2

United States Patent
Nomoto

(10) Patent No.: US 11,955,502 B2
(45) Date of Patent: Apr. 9, 2024

(54) SOLID-STATE IMAGE SENSOR TO REDUCE DISPLAY UNEVENNESS OF A CAPTURED IMAGE

(71) Applicant: SONY SEMICONDUCTOR SOLUTIONS CORPORATION, Kanagawa (JP)

(72) Inventor: Kazuki Nomoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 374 days.

(21) Appl. No.: 17/250,752

(22) PCT Filed: Aug. 8, 2019

(86) PCT No.: PCT/JP2019/031310
§ 371 (c)(1),
(2) Date: Mar. 1, 2021

(87) PCT Pub. No.: WO2020/054282
PCT Pub. Date: Mar. 19, 2020

(65) Prior Publication Data
US 2021/0351223 A1 Nov. 11, 2021

(30) Foreign Application Priority Data
Sep. 11, 2018 (JP) .................. 2018-169725

(51) Int. Cl.
*H01L 27/146* (2006.01)
*H01L 27/148* (2006.01)
*H04N 25/60* (2023.01)

(52) U.S. Cl.
CPC .. *H01L 27/14643* (2013.01); *H01L 27/14603* (2013.01); *H01L 27/14612* (2013.01);
(Continued)

(58) Field of Classification Search
CPC ......... H01L 27/14643; H01L 27/14603; H01L 27/14612; H01L 27/14621; H01L 27/14636; H01L 27/14831
See application file for complete search history.

(56) References Cited

U.S. PATENT DOCUMENTS 5,998,842 A 12/1999 Sano
6,218,703 B1 4/2001 Sano
(Continued)

FOREIGN PATENT DOCUMENTS

| CN | 103460688 A | 12/2013 |
| CN | 109155829 A | 1/2019 |

(Continued)

OTHER PUBLICATIONS

International Search Report and Written Opinion of PCT Application No. PCT/JP2019/031310, dated Oct. 15, 2019, 10 pages of ISRWO.

*Primary Examiner* — Ahmed A Berhan
(74) *Attorney, Agent, or Firm* — CHIP LAW GROUP

(57) ABSTRACT

It is an object of the present technology to provide a solid-state image sensor capable of reducing display unevenness of a captured image. A solid-state image sensor includes a first substrate that includes a photoelectric conversion unit, a transfer gate unit that is connected to the photoelectric conversion unit, an FD unit that is connected to the transfer gate unit, and an interlayer insulating film that covers the photoelectric conversion unit, the transfer gate unit, and the FD unit. The solid-state image sensor further includes a second substrate that includes an amplifier transistor and is disposed to be adjacent to the interlayer insulating film, the amplifier transistor constituting a part of a pixel transistor connected to the FO unit via the interlayer insulating film and including a back gate unit.

9 Claims, 23 Drawing Sheets

(52) U.S. Cl.
CPC .. *H01L 27/14621* (2013.01); *H01L 27/14636* (2013.01); *H01L 27/14831* (2013.01); *H04N 25/60* (2023.01)

(56) References Cited

U.S. PATENT DOCUMENTS

| | | | |
|---|---|---|---|
| 2004/0104760 A1 | 6/2004 | Ando | |
| 2005/0007182 A1 | 1/2005 | Ando | |
| 2007/0216564 A1 | 9/2007 | Koseki | |
| 2013/0105871 A1 | 5/2013 | Inui | |
| 2014/0054447 A1 | 2/2014 | Kato | |
| 2014/0160332 A1 | 6/2014 | Sumi | |
| 2017/0025456 A1* | 1/2017 | Ohmaru | H01L 27/14618 |
| 2018/0233525 A1 | 8/2018 | Ikeda | |

FOREIGN PATENT DOCUMENTS

| | | |
|---|---|---|
| EP | 2698988 A1 | 2/2014 |
| EP | 3468169 A1 | 4/2019 |
| JP | 8-046145 A | 2/1996 |
| JP | 9-7906 A | 1/1997 |
| JP | 2007-251325 A | 9/2007 |
| JP | 2012-015400 A | 1/2012 |
| JP | 2012084610 A | 4/2012 |
| JP | 2012-222649 A | 11/2012 |
| JP | 2014-41972 A | 3/2014 |
| JP | 2016009739 A | 1/2016 |
| JP | 2017028286 A | 2/2017 |
| JP | 2017034677 A | 2/2017 |
| JP | 2018026812 A | 2/2018 |
| JP | 2018041943 A | 3/2018 |
| KR | 20120036263 A | 4/2012 |
| KR | 10-2014-0006920 A | 1/2014 |
| KR | 10-2019-0015201 A | 2/2019 |
| TW | 201810134 A | 3/2018 |
| WO | 2012/001939 A1 | 1/2012 |
| WO | 2012/141042 A1 | 10/2012 |
| WO | WO-2017057277 A1 | 4/2017 |
| WO | 2017/209221 A1 | 12/2017 |

\* cited by examiner

SOLID-STATE IMAGE SENSOR TO REDUCE DISPLAY UNEVENNESS OF A CAPTURED IMAGE

CROSS REFERENCE TO RELATED APPLICATIONS

This application is a U.S. National Phase of International Patent Application No. PCT/JP2019/031310 filed on Aug. 8, 2019, which claims priority benefit of Japanese Patent Application No. JP 2018-169725 filed in the Japan Patent Office on Sep. 11, 2018. Each of the above-referenced applications is hereby incorporated herein by reference in its entirety.

TECHNICAL FIELD

The present technology relates to a solid-state image sensor.

BACKGROUND ART

Patent Literature 1 discloses a solid-state image sensor capable of reducing noise caused by a leakage current.

CITATION LIST

Patent Literature

Patent Literature 1: Japanese Patent Application Laid-open No. 2014-41972

DISCLOSURE OF INVENTION

Technical Problem

As disclosed in Patent Literature 1, there is a problem that the effects of noise control cannot be sufficiently achieved even if the leakage (noise) to a memory is reduced by suppressing a back gate of a sampling transistor and an analog memory reset transistor constituting a pixel.

It is an object of the present technology to provide a solid-state image sensor capable of reducing display unevenness of a captured image.

Solution to Problem

In order to achieve the above-mentioned object, a solid-state image sensor according to an embodiment of the present technology includes: a first substrate that includes a photoelectric conversion unit, a transfer gate unit that is connected to the photoelectric conversion unit, a floating diffusion unit that is connected to the transfer gate unit, and an insulating film that covers the photoelectric conversion unit, the transfer gate unit, and the floating diffusion unit; and a second substrate that includes a first transistor and is disposed to be adjacent to the insulating film, the first transistor constituting a part of a circuit connected to the floating diffusion unit via the insulating film and including a back gate.

The first transistor may have a SOI structure.

The first transistor may include a front gate connected to the back gate.

The back gate may include a back gate electrode and a back gate insulating film, the front gate may include a front gate electrode and a front gate insulating film, and the back gate insulating film and the front gate insulating film may have different film types or different film structures.

The back gate may include a back gate electrode and a back gate insulating film, the front gate may include a front gate electrode and a front gate insulating film, and the back gate insulating film and the front gate insulating film may have different film quality.

The second substrate may include a switch unit connected to the back gate.

The solid-state image sensor according to the embodiment described above may further include a third substrate that is disposed to be adjacent to the second substrate, a comparator circuit being formed on the third substrate, the comparator circuit including a transistor that includes a back gate and has a SOI structure.

The solid-state image sensor according to the embodiment described above may further include a third substrate that is disposed to be adjacent to the second substrate, a comparator circuit being formed on the third substrate, the comparator circuit including a transistor that includes a back gate and has a bulk silicon structure.

The second substrate may include a second transistor constituting a part of the circuit, and an interlayer insulating film formed between the first transistor and the second transistor.

The second substrate may include a plurality of the first transistors, and front gates may be provided to be connectable to each other in at least a part of the plurality of first transistors.

The first substrate may include a plurality of the photoelectric conversion units and a plurality of the transfer gate units.

MODE(S) FOR CARRYING OUT THE INVENTION

A schematic configuration of a substrate of a solid-state image sensor common to the respective embodiments according to the present technology will be described with reference to FIG. 1.

Figure 1:
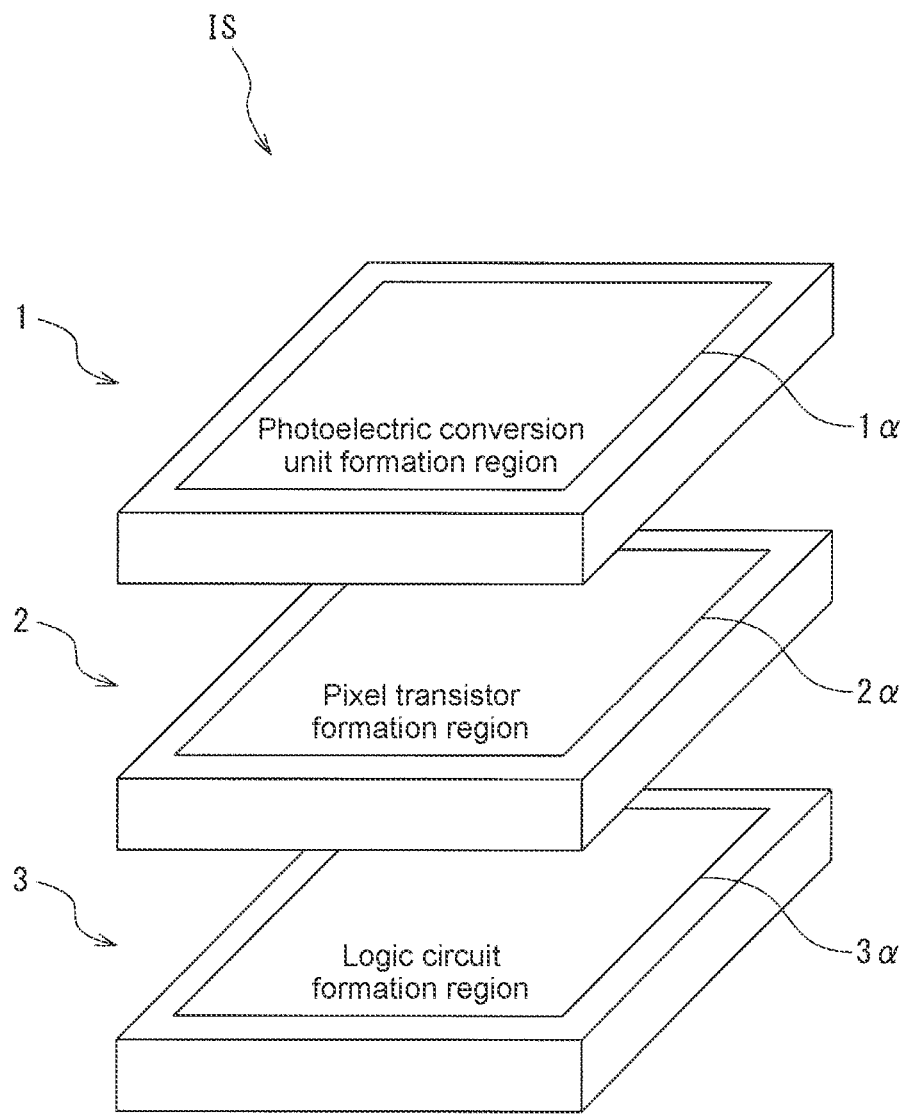
FIG. 1 is a diagram showing a configuration example of a substrate of a solid-state image sensor according to the present technology.

As shown in FIG. 1, a solid-state image sensor IS according to the present technology has a substrate stacked structure in which three substrates, i.e., a first substrate 1, a second substrate 2, and a third substrate, are stacked. The first substrate 1 is a photoelectric conversion substrate including a plurality of photoelectric conversion units (not shown) that photoelectrically converts incident light into charges (electrons in the present technology) having the amount corresponding to the amount of the incident light. The first substrate 1 has a photoelectric conversion unit formation region 1α in which photoelectric conversion units are arranged in a two-dimensional array pattern. The photoelectric conversion unit includes, for example, a photodiode. A detailed configuration of the photoelectric conversion unit will be described below.

The second substrate 2 is disposed to be adjacent to the first substrate 1. The second substrate 2 includes a pixel transistor (details thereof will be described below) constituting a pixel together with the photoelectric conversion unit provided on the first substrate 1. The second substrate 2 has a pixel transistor formation region 2α in which a pixel transistor has been formed. The pixel transistor includes a plurality of pixel transistors provided corresponding to the photoelectric conversion units. The pixel transistor includes a plurality of transistors that controls the photoelectric conversion units. A detailed configuration of the pixel transistor will be described below.

The third substrate 3 is disposed to be adjacent to the second substrate 2. The third substrate 3 includes a logic circuit (not shown) that executes predetermined signal processing using an analog electrical signal transmitted from the pixel transistor provided on the second substrate 2. The third substrate 3 has a logic circuit formation region 3α in which a logic circuit has been formed. The logic circuit includes not only a signal processing circuit that executes the predetermined signal processing but also a control circuit that controls the signal processing circuit, the photoelectric conversion unit provided on the first substrate 1, the pixel transistor provided on the second substrate 2, and the like. Further, the third substrate 3 includes an input terminal (not shown) for inputting a control signal for controlling the logic circuit from the outside of the solid-state image sensor IS. Further, the third substrate 3 includes an output terminal for outputting, to the outside of the solid-state image sensor IS, an output signal to be output from the logic circuit.

First Embodiment

Figure 2:
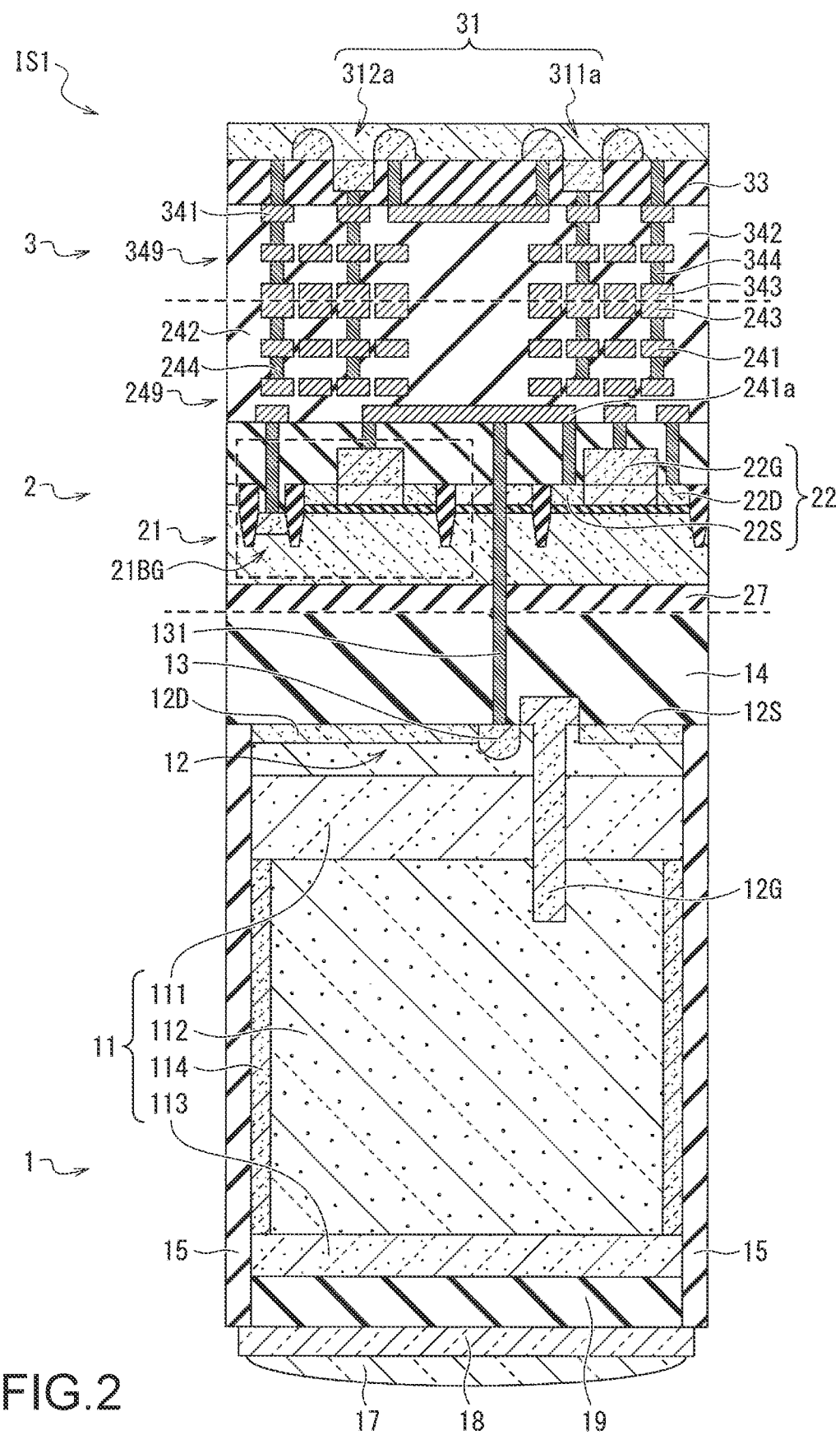
FIG. 2 is a cross-sectional view showing a schematic configuration of one pixel of a solid-state image sensor according to a first embodiment of the present technology.

A solid-state image sensor according to a first embodiment of the present technology will be described using FIG. 2 to FIG. 18. FIG. 2 is a cross-sectional view of one pixel of a plurality of pixels provided in a solid-state image sensor IS1 according to this embodiment. Note that in FIG. 2, for ease of understanding, the incident side of light is illustrated on the lower side.

As shown in FIG. 2, the solid-state image sensor IS1 according to this embodiment includes the first substrate 1 including a photoelectric conversion unit 11, a transfer gate unit 12G connected to the photoelectric conversion unit 11, a floating diffusion (hereinafter, abbreviated as "FD") unit 13 connected to the transfer gate unit 12G, and an interlayer insulating film (an example of an insulating film) 14 that convers the photoelectric conversion unit 11, the transfer gate unit 12G, and the FD unit 13. The photoelectric conversion unit 11 includes a photodiode formed of, for example, N-type silicon.

More specifically, the photoelectric conversion unit 11 provided on the first substrate 1 has a well region 111 of a first conductive type (p-type), and a charge generation region 112 of a second conductive type (n-type) provided on the well region 111 to be in contact with the well region 111. In the photoelectric conversion unit 11, the well region 111 and the charge generation region 112 form a pn junction. The photoelectric conversion unit 11 includes a p+ bottom-portion pinning layer 113 provided on the charge generation region 112 to be in contact with the charge generation region 112, and a p+ side-surface pinning layer 114 that surrounds side walls of the charge generation region 112. The charge generation region 112 of the photoelectric conversion unit 11 functions as a part of the photodiode that generates charges (electrons). That is, the photoelectric conversion unit 11 is capable of suppressing the generation of a dark current on the interface with the bottom-portion pinning layer 113 on the upper surface side of the charge generation region 112, the interface with the side-surface pinning layer 114 on the side surface side, and the interface with the well region 111.

Inside the first substrate 1, the pixel separation unit 15 for electrically isolating a plurality of pixels arranged in a matrix pattern from each other is provided. The photoelectric conversion unit 11 is provided in each of a plurality of regions partitioned by the pixel separation unit 15. The pixel separation unit 15 is formed in a grid shape so as to be interposed between the plurality of pixels, for example, when the solid-state image sensor IS1 shown in FIG. 2 is viewed from the first substrate 1 side, i.e. the incident side of light. The shape of the pixel separation unit 15 is not limited to a rectangular lattice, and may be another topology such as a hexagonal honeycomb lattice. The photoelectric conversion unit 11 serving as a pixel is disposed in each of the regions partitioned in a grid shape by the pixel separation unit 15.

Each pixel of the solid-state image sensor IS1 according to this embodiment includes the transfer gate unit 12G that transfers signal charges from the photoelectric conversion unit 11 of the corresponding pixel. A part of the transfer gate unit 12G is provided so as to penetrate through the well region 111 to reach the charge generation region 112. Further, the remainder of the transfer gate unit 12G is provided protruding from the well region 111.

An n+ source unit 12S and an n+ drain unit 12D are provided on both sides of the transfer gate unit 12G. The transfer gate unit 12G, the source unit 12S, and the drain unit 12D constitute a transfer transistor 12.

In the first substrate 1, the FD unit 13 is provided to be adjacent to the transfer gate unit 12G and partially overlap the drain unit 12D. The FD unit 13 temporarily accumulates signal charges transferred from the photoelectric conversion unit 11. The remainder of the FD unit 13 is embedded in the well region 111. The FD unit 13 has an electrically floating semiconductor region such as a floating diffusion region.

The interlayer insulating film 14 is provided to be in contact with the FD unit 13, the transfer gate unit 12G, the source unit 12S, and the drain unit 12D. An opening that exposes a part of the FD unit 13 is formed in the interlayer insulating film 14, and a connection wiring 131 is embedded in this opening. The connection wiring 131 is connected to an amplifier transistor 21 and a reset transistor 22 (details thereof will be described below) provided on the second substrate 2.

In the first substrate 1, a flattening film 19 is provided to be in contact with the bottom-portion pinning layer 113. The solid-state image sensor IS1 according to this embodiment has a back surface irradiation type structure. For this reason, the flattening film 19 is formed using an insulating material such as $SiO_2$, which causes light to be transmitted therethrough. The pixel separation unit 15 is provided by covering the inside of the excavated pixel isolation groove with an insulating film and filling the pixel isolation groove with a light-shielding metal such as tungsten (W) via this insulating film. Note that as an insulating film for covering the inside of the pixel separation groove, a "fixed charge film" such as a hafnium oxide film ($HfO_2$ film) may be used, and the pixel separation groove may be filled with an insulating film or the like to form the pixel separation unit 15. As a fixed charge film for forming the pixel separation unit 15, an insulating film containing at least one of oxides of Hf, zirconium (Zr), aluminum (Al), tantalum (Ta), titanium (Ti), magnesium (Mg), yttrium (Y), and a lanthanide element can be used in addition to $HfO_2$. In the case where the pixel separation unit 15 includes a fixed charge film, the side-surface pinning layer 114 constituting the interface on the side surface with the charge generation region 112 of the photoelectric conversion unit 11 may be omitted.

The first substrate 1 includes the flattening film 19, a color filter (CF) 18, and a microlens 17 provided on the incident side of light of the photoelectric conversion unit 11. The flattening film 19, the color filter (CF) 18, and the microlens 17 constitute a light incident portion. The incident light that has entered sequentially via the microlens 17, the color filter 18, and the flattening film 19 is received by the photoelectric conversion unit 11 and is photoelectrically converted.

The solid-state image sensor IS1 includes the second substrate 2 that includes the amplifier transistor (an example of a first transistor) 21 and is disposed to be adjacent to the interlayer insulating film 14, the amplifier transistor 21 constituting a part of the pixel transistor (an example of a circuit) connected to the FD unit 13 via the interlayer insulating film 14 and including a back gate 21BG. The amplifier transistor 21 includes, for example, an N-type MOSFET. A detailed configuration of the amplifier transistor 21 will be described below. The first substrate 1 and the second substrate 2 are bonded together with an adhesive, for example, in a state in which electric connection in a predetermined region is secured.

The second substrate 2 includes the reset transistor 22 connected to the amplifier transistor 21, and a selection transistor 23 (not shown in FIG. 2, see FIG. 3) connected to the amplifier transistor 21. Further, the second substrate 2 includes a stacked unit 249 including a wiring electrode 241, an insulating film 242, and a bonding electrode 243. The wiring electrode 241 and the insulating film 242 are formed by being alternately stacked. The bonding electrode 243 is formed to be partially exposed on the surface of the stacked unit 249. The stacked unit 249 includes a connection electrode 244 embedded in a through hole formed in the insulating film 242. The connection electrode 244 is provided at a predetermined position, and is configured to electrically connect the wiring electrodes 241 to each other and to connect the wiring electrode 241 and the bonding electrode 243 to each other.

Figure 3:
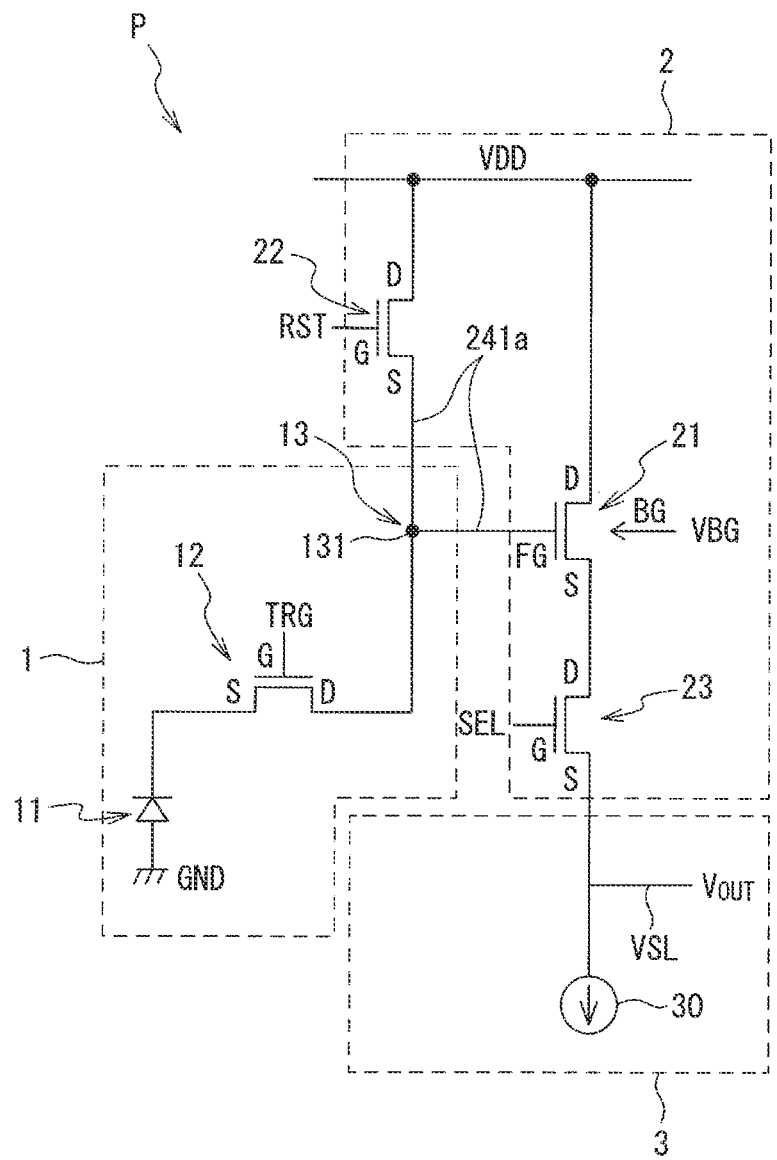
FIG. 3 is a diagram showing a circuit configuration example of one pixel of the solid-state image sensor according to the first embodiment of the present technology.

The solid-state image sensor IS1 includes the third substrate 3 including a logic circuit. FIG. 3 illustrates a comparator circuit 31 constituting a part of the logic circuit. The comparator circuit 31 is provided in an ADC (analog-to-digital converter) that converts the analog electrical signal photoelectrically converted by the photoelectric conversion unit 11 into a digital signal. The solid-state image sensor IS1 according to this embodiment has a configuration in which an ADC is provided for each pixel. Further, the third substrate 3 includes a stacked unit 349 including a wiring electrode 341, an insulating film 342, and a bonding electrode 343. The wiring electrode 341 and the insulating film 342 are formed by being alternately stacked. The bonding electrode 343 is formed to be partially exposed on the surface of the stacked unit 349. The stacked unit 349 includes a connection electrode 344 embedded in a through hole formed in the insulating film 342. The connection electrode 344 is provided at a predetermined position, and is configured to electrically connect the wiring electrodes 341 to each other and to connect the wiring electrode 341 and the bonding electrode 343 to each other.

The second substrate 2 and the third substrate 3 are disposed so that a bonding electrode 24 and a bonding electrode 34 face each other. The second substrate 2 and the third substrate 3 are bonded to each other with the bonding electrode 24 and the bonding electrode 34 and with the insulating film 242 and the insulating film 342 in the heat treatment step in the manufacturing process of the solid-state image sensor IS1.

<Configuration Example of Pixel>

Next, a circuit configuration of a pixel provided in the solid-state image sensor IS1 according to this embodiment will be described using FIG. 3 while referring to FIG. 2. The plurality of pixels provided in the solid-state image sensor IS1 has the same circuit configuration. For this reason, FIG. 3 illustrates a circuit configuration of one pixel P of the plurality of pixels. Further, in FIG. 3, reference symbols of a gate unit, a source unit, and a drain unit of the transistors are respectively denoted by "G", "S", and "D". Further, reference symbols of a front gate unit, a back gate unit, a source unit, and a drain unit of the amplifier transistor are respectively denoted by "FG", "BG", "G", "S" and "D".

As shown in FIG. 3, the pixel P provided in the solid-state image sensor IS1 includes the photoelectric conversion unit 11 that includes, for example, a photodiode. The pixel P includes four transistors, i.e., the transfer transistor 12, the amplifier transistor 21, the selection transistor 23, and the reset transistor 22, as active elements with respect to the photoelectric conversion unit 11. The transfer transistor 12 is provided on the first substrate 1, and the amplifier transistor 21, the selection transistor 23, and the reset transistor 22 are provided on the second substrate 2. As described above, in the solid-state image sensor IS1, one pixel is formed over the stacked substrate. Further, the amplifier transistor 21, the selection transistor 23, and the reset transistor 22 provided on the second substrate 2 constitute a pixel transistor. Note that the pixel transistor may also include the transfer transistor 12 although the substrate on which it is formed differs.

The transfer transistor 12 is connected between the photoelectric conversion unit 11 and the FD unit 13. The source unit 12S of the transfer transistor 12 is connected to a cathode of the photodiode constituting the photoelectric conversion unit 11. The transfer gate unit 12G of the transfer transistor 12 is connected to an input terminal (not shown) to which a drive signal TRG is input. The drain unit 12D of the transfer transistor 12 is connected to the FD unit 13. The transfer transistor 12 is configured to transfer, when being turned on by the drive signal TRG supplied from the vertical scanning circuit (not shown) constituting the logic circuit provided on the third substrate 3, charges accumulated in the photoelectric conversion unit 11 to the FD unit 13.

A front gate 12FG of the amplifier transistor 21 is connected to a cathode of the FD unit 13 via the transfer transistor 12 and the connection wiring 131. An anode of the FD unit 13 is connected to a ground GND.

A front gate FG21 of the amplifier transistor 21 is connected to a source unit 22S of the reset transistor 22 via a connection wiring 241a. A drain unit 21D of the amplifier transistor 21 is connected to a power source VDD. A source unit 21S of the amplifier transistor 21 is connected to a drain unit 23D of the selection transistor 23. The source unit 21S of the amplifier transistor 21 and the drain unit 23D of the selection transistor 23 are shared by N-type impurity regions. A back gate unit 21BG of the amplifier transistor 21 is connected to an input terminal (not shown) to which a back gate voltage VBG is input. The input terminal is disposed in an input terminal unit provided on the third substrate 3. As will be described below in detail, the amplifier transistor 21 is configured to control the noise generated in the pixel P, by controlling the voltage applied to the back gate unit 21BG by the back gate voltage VBG.

A source unit 23S of the selection transistor 23 is connected to a signal line VSL. A gate unit 23G of the selection transistor 23 is connected to an input terminal (not shown) to which a drive signal SEL is input. The amplifier transistor 21 is connected to the signal line VSL via the selection transistor 23. The amplifier transistor 21 constitutes a source follower, together with a constant current source 30 provided on the third substrate 3. When the selection transistor 23 is turned on by the drive signal SEL supplied from the scanning circuit (not shown) constituting the logic circuit provided on the third substrate 3, the amplifier transistor 21 amplifies a potential of the FD unit 13, and outputs a pixel signal Vout indicating a voltage corresponding to the potential to the signal line VSL. The pixel signal Vout output from the pixel P is supplied to the comparator circuit 31 (see FIG. 2) of an ADC (not shown) provided corresponding to the pixel P via the signal line VSL.

The reset transistor 22 is connected between the power source VDD and the FD unit 13. A drain unit 22D of the reset transistor 22 is connected to the power source VDD. The source unit 22S of the reset transistor 22 is connected to the FD unit 13. A gate unit 22G of the reset transistor 22 is connected to an input terminal (not shown) to which a drive signal RST is input. When the reset transistor 22 is turned on by the drive signal RST supplied from the scanning circuit (not shown), the potential of the FD unit 13 is reset to the potential of the power source VDD.

The FD unit 13 is formed at an electric connecting point between the transfer transistor 12, the amplifier transistor 21, and the reset transistor 22. The transfer transistor 12, the amplifier transistor 21, the reset transistor 22, and the selection transistor 23 each include, for example, an N-type metal-oxide-semiconductor field-effect transistor (MOSFET).

(Configuration of Wiring Layout of Pixel Transistor)

Figure 4:
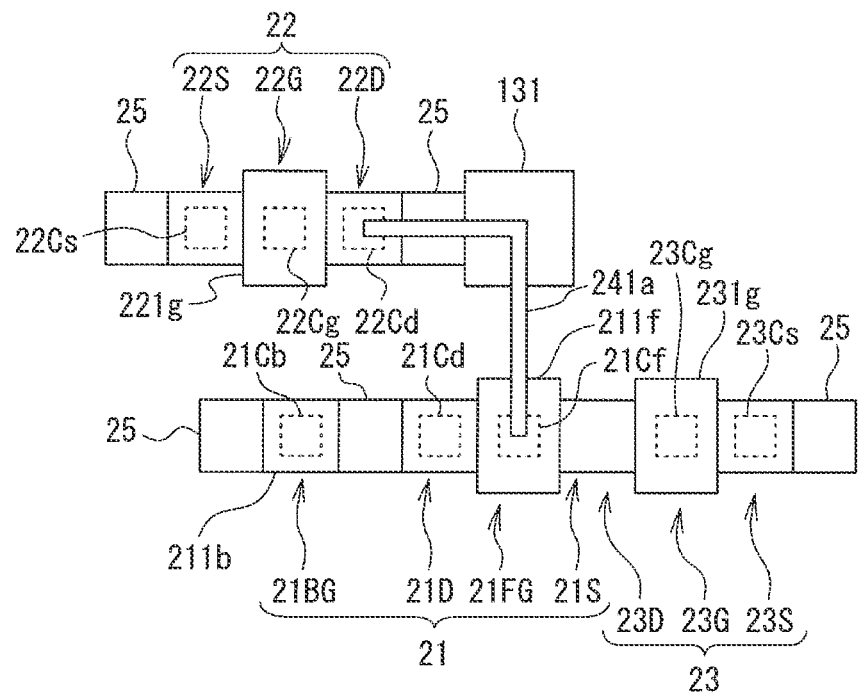
FIG. 4 is a diagram showing an example of wiring layout of a pixel transistor provided in the solid-state image sensor according to the first embodiment of the present technology.

Next, a configuration example of wiring layout of a pixel transistor provided on the second substrate 2 will be described with reference to FIG. 4. FIG. 4 illustrates wiring layout of a pixel transistor provided in the pixel P shown in FIG. 3.

As shown in FIG. 4, the drain unit 21D is disposed on one side of a front gate unit 21FG of the amplifier transistor 21, and the source unit 21S shared with the drain unit 23D of the selection transistor 23 is disposed on the other side. The drain unit 21D and the source unit 21S each have an N-type impurity region. A front gate electrode 211f of the front gate unit 21FG is formed of, for example, polysilicon. The back gate unit 21BG of the amplifier transistor 21 is disposed to be adjacent to the drain unit 21D via an element separation region 25. A back gate electrode 211b constituting the back gate unit 21BG has, for example, a high-concentration impurity region. The element separation region 25 is formed using, for example, an STI (Shallow Trench Isolation) technology.

The drain unit 23D is disposed on one side of the gate unit 23G of the selection transistor 23, and the source unit 23S is disposed on the other side. A gate electrode 231g constituting the gate unit 23G of the selection transistor 23 is formed of, for example, polysilicon. The source unit 23S has, for example, an N-type impurity region. The selection transistor 23 and the amplifier transistor 21 are disposed in a substantially straight line.

The source unit 22S is disposed on one side of the gate unit 22G of the reset transistor 22, and the drain unit 22D is disposed on the other side. A gate electrode 221g of the gate unit 22G of the reset transistor 22 is formed of, for example, polysilicon. The source unit 22S and the drain unit 22D each have, for example, an N-type impurity region. The reset transistor 22 is disposed in parallel with the amplifier transistor 21 and the selection transistor 23.

The connection wiring 241a having a bent shape is formed between the front gate electrode 211f of the front gate unit 21FG of the amplifier transistor 21 and the drain unit 22D of the reset transistor 22. One end of the connection wiring 241a is connected to a contact region 21Cf formed on the front gate unit 21FG of the amplifier transistor 21. The other end of the connection wiring 241a is connected to a contact region 22Cd formed on the drain unit 22D of the reset transistor 22. The contact region 21Cf has a configuration in which a part of the front gate electrode 211f of the amplifier transistor 21 is exposed and a metal (e.g., copper) electrode is embedded in an opening formed in an interlayer insulating film 26 (see FIG. 2). The contact region 22Cd has a configuration in which a part of the drain unit 22D of the reset transistor 22 is exposed and a metal (e.g., copper) electrode is embedded in an opening formed in the interlayer insulating film 26 (see FIG. 2). One end and the other end of the connection wiring 241a are connected to these metal electrodes.

The connection wiring 131 connected to the FD unit 13 formed on the first substrate 1 is formed in the bent portion of the connection wiring 241a. The connection wiring 131 penetrates through the interlayer insulating film 26, the bulk-silicon forming the second substrate 2, and the interlayer insulating film 14 formed on the first substrate 1, and is formed by being embedded in an opening that opens a part of the FD unit 13.

A contact region 21Cd having the same configuration as that of the contact region 21Cf is formed on the drain unit 21D of the amplifier transistor 21. As a result, the drain unit 21D is connected to the power source VDD and a power supply voltage can be applied thereto. A contact region 21Cb having the same configuration as that of the contact region 21Cf is formed on the back gate electrode 211b of the back gate unit 21BG of the amplifier transistor 21. As a result, the back gate unit 21BG is connected to the input terminal to which the back gate voltage VBG is input, and the back gate voltage VBG can be applied thereto.

A contact region 23Cg having the same configuration as that of the contact region 21Cf is formed on the gate unit 23G of the selection transistor 23. As a result, the gate unit 23G of the selection transistor 23 is connected to the input terminal to which the drive signal SEL is input, and the on/off state can be controlled by the drive signal SEL. Further, a contact region 23Cs having the same configuration as that of the contact region 21Cf is formed on the source unit 23S of the selection transistor 23. As a result, the source unit 23S of the selection transistor 23 is connected to the signal line VSL, and the pixel signal Vout can be output to the logic circuit provided on the third substrate 3.

A contact region 22Cg having the same configuration as that of the contact region 21Cf is formed on the gate unit 22G of the reset transistor 22. As a result, the gate unit 22G of the reset transistor 22 is connected to the input terminal to which the drive signal TRG is input, and the on/off state can be controlled by the drive signal TRG. Further, a contact region 22Cs connected to the side-surface pinning layer 114 formed on the first substrate 1 is formed on the source unit 22S of the reset transistor 22. The contact region 22Cs penetrates through the interlayer insulating film 26, the bulk-silicon forming the second substrate 2, and the interlayer insulating film 14 formed on the first substrate 1, and is formed by embedding a metal (e.g., copper) electrode in an opening that opens a part of the source unit 22S. As a result, the source unit 22S of the reset transistor 22 is connected to the anode of the photodiode constituting the photoelectric conversion unit 11.

(Configuration of Amplifier Transistor)

Next, a configuration of the amplifier transistor 21 provided in the solid-state image sensor IS1 according to this embodiment will be described with reference to FIG. 5.

Figure 5:
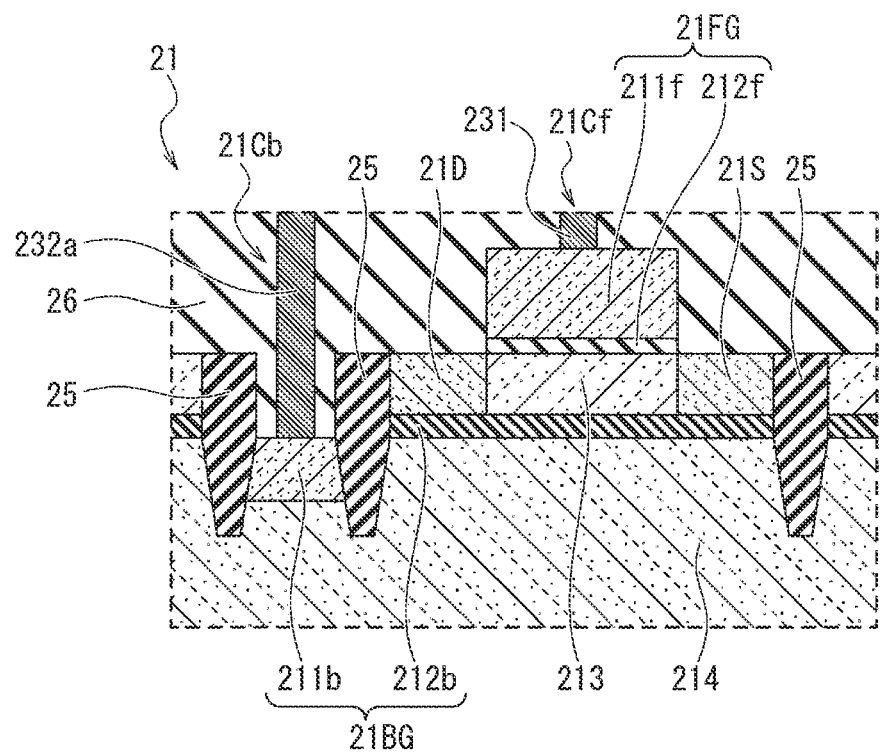
FIG. 5 is a cross-sectional view showing a schematic configuration of an amplifier transistor provided in the solid-state image sensor according to the first embodiment of the present technology.

As shown in FIG. 5, the amplifier transistor 21 includes a P-type silicon substrate 214, a back gate insulating film 212b formed on the silicon substrate 214, and a silicon layer 213 formed on the back gate insulating film 212b. As described above, the amplifier transistor 21 has a SOI structure including the silicon layer 213 on the back gate insulating film 212b. The back gate insulating film 212b includes, for example, a buried oxide film (BOX: Buried Oxide). The silicon layer 213 includes a P-type silicon film having an impurity concentration of, for example, $5\times10^{17}$ to $1\times10^{20}$ (/cm$^3$).

Further, the amplifier transistor 21 includes the front gate unit 21FG formed on the silicon layer 213. The amplifier transistor 21 includes the source unit 21S formed on the silicon layer 213 on one side of the front gate unit 21FG, and the drain unit 21D formed on the silicon layer 213 on the other side. The front gate unit 21FG includes a front gate insulating film 212f formed on the silicon layer 213, and the front gate electrode 211f formed on the front gate insulating film 212f.

The amplifier transistor 21 includes the back gate electrode 211b formed on the silicon substrate 214. The back gate electrode 211b has a high-concentration impurity region formed on the silicon substrate 214. The back gate electrode 211b is separated from the drain unit 21D by the element separation region 25. The back gate electrode 211b and the back gate insulating film 212b constitute the back gate unit 21BG.

In the solid-state image sensor IS1 according to this embodiment, the back gate voltage VBG to be applied to the back gate unit 21BG of the amplifier transistor 21 may be adjusted for each pixel. Further, in the solid-state image sensor IS1 according to this embodiment, the back gate voltage VBG applied to the back gate unit 21BG of the amplifier transistor 21 may be adjusted for each pixel included in a predetermined area.

(Method of Producing Amplifier Transistor)

Next, a method of producing the amplifier transistor 21 provided in the solid-state image sensor IS1 according to this embodiment will be described using FIG. 6 to FIG. 17. In this embodiment, a plurality of amplifier transistors is simultaneously formed on one wafer, and a step of manufacturing one amplifier transistor of the plurality of amplifier transistors is illustrated in FIG. 6 to FIG. 17. Further, in FIG. 9 to FIG. 17, illustration of the first substrate 1 is omitted in order to make it easier to understand.

Figure 6:
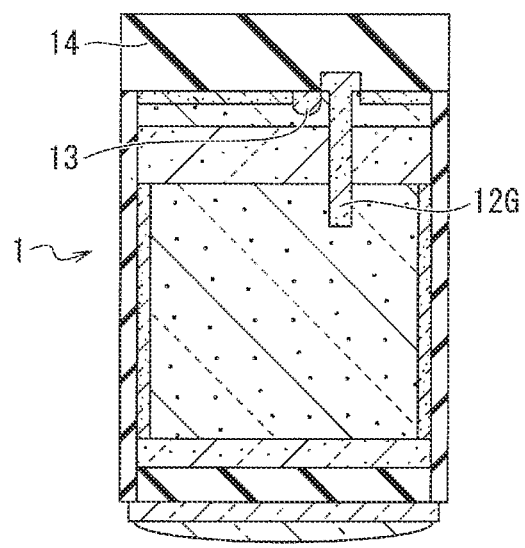
FIG. 6 is a manufacturing process cross-sectional view (Part 1) of the amplifier transistor provided in the solid-state image sensor according to the first embodiment of the present technology.

Although detailed description is omitted, as shown in FIG. 6, the first substrate 1 including the photoelectric conversion unit 11, the transfer gate unit 12G, the FD unit 13, and the interlayer insulating film 14 is formed.

Figure 7:
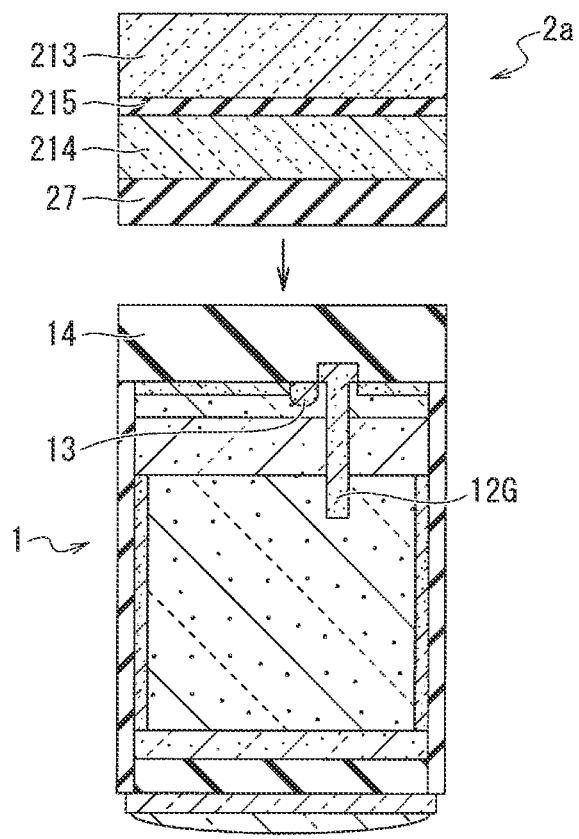
FIG. 7 is a manufacturing process cross-sectional view (Part 2) of the amplifier transistor provided in the solid-state image sensor according to the first embodiment of the present technology.

Next, as shown in FIG. 7, an insulating film 27 is formed on one surface of the wafer-like silicon substrate 214, an insulating film 215 to be the back gate insulating film 212b in the future is formed on the other surface of the silicon substrate 214, and a SOI substrate 2a on which the silicon layer 213 has been formed is formed on the insulating film 215.

Figure 8:
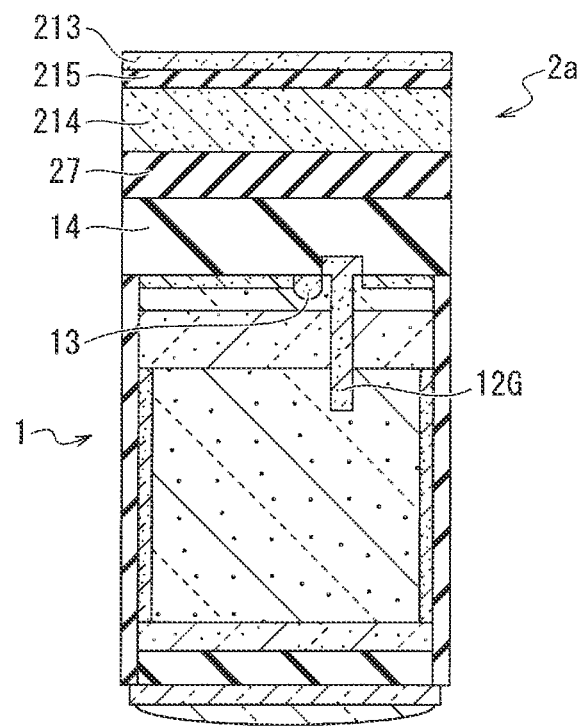
FIG. 8 is a manufacturing process cross-sectional view (Part 3) of the amplifier transistor provided in the solid-state image sensor according to the first embodiment of the present technology.

Next, as shown in FIG. 8, the SOI substrate 2a and the first substrate 1 are bonded to each other using, for example, an adhesive (not shown) while the insulating film 27 faces the interlayer insulating film 14 formed on the first substrate 1.

Figure 9:
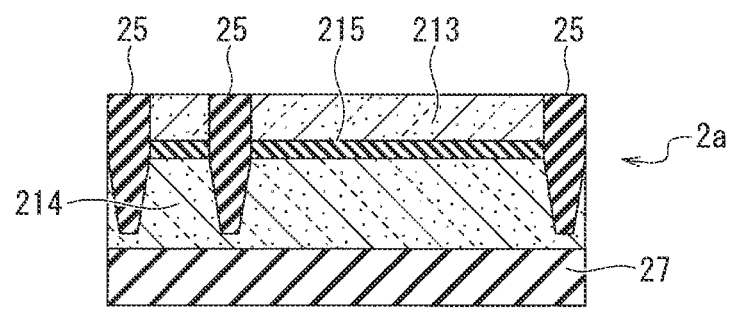
FIG. 9 is a manufacturing process cross-sectional view (Part 4) of the amplifier transistor provided in the solid-state image sensor according to the first embodiment of the present technology.

Next, as shown in FIG. 9, the element separation region 25 is formed in a predetermined region of the SOI substrate 2a using an STI technology.

Figure 10:
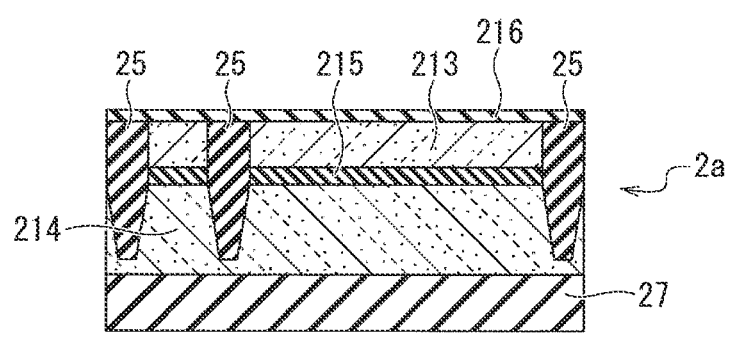
FIG. 10 is a manufacturing process cross-sectional view (Part 5) of the amplifier transistor provided in the solid-state image sensor according to the first embodiment of the present technology.

Next, as shown in FIG. 10, an oxide film 216 to be the front gate insulating film 212f in the future is formed on the SOI substrate 2a. The oxide film 216 is deposited using thermal oxidation treatment or a predetermined deposition technology.

Figure 11:
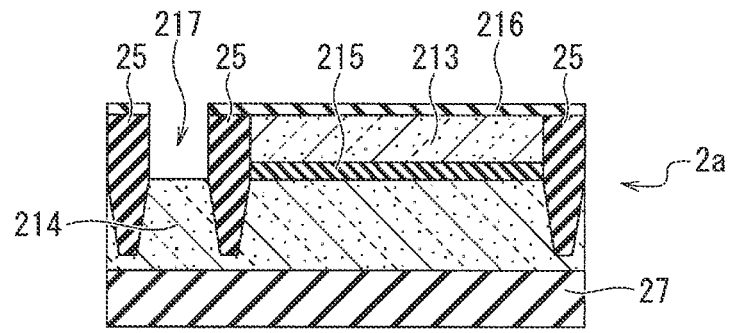
FIG. 11 is a manufacturing process cross-sectional view (Part 6) of the amplifier transistor provided in the solid-state image sensor according to the first embodiment of the present technology.

Next, a resist is applied onto the oxide film 216 and patterned to form a resist pattern (not shown) opening a region where the back gate electrode 211b is to be formed. Next, as shown in FIG. 11, using this resist pattern as a mask, the oxide film 216, the silicon layer 213, and the insulating film 215 to be opened by the resist pattern are sequentially etched and removed. As a result, an opening 217 is formed in the region where a back gate electrode 211 is to be formed. Next, the resist pattern is removed.

Figure 12:
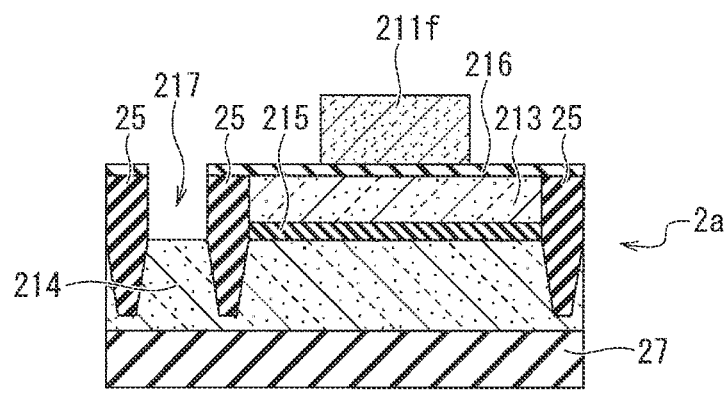
FIG. 12 is a manufacturing process cross-sectional view (Part 7) of the amplifier transistor provided in the solid-state image sensor according to the first embodiment of the present technology.

Next, polysilicon is formed on the SOI substrate 2a including the insulating film 215 and the opening 217. Then, a resist is applied onto the polysilicon and patterned to form a resist pattern (not shown) in which the resist remains in a region where the front gate insulating film 212f is to be formed. Next, as shown in FIG. 12, using this resist pattern as a mask, polysilicon in the region not covered by the resist pattern is etched and removed. As a result, a front gate electrode 211F is formed. Next, the resist pattern is removed.

Figure 13:
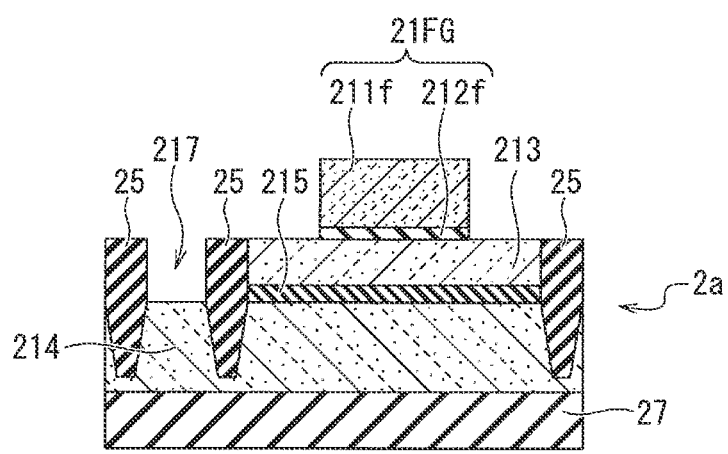
FIG. 13 is a manufacturing process cross-sectional view (Part 8) of the amplifier transistor provided in the solid-state image sensor according to the first embodiment of the present technology.

Next, as shown in FIG. 13, using the front gate electrode 211f as a mask, the oxide film 216 of the region not covered by the front gate electrode 211f is etched and removed. As a result, the front gate insulating film 212f is formed and the front gate unit 21FG is formed.

Figure 14:
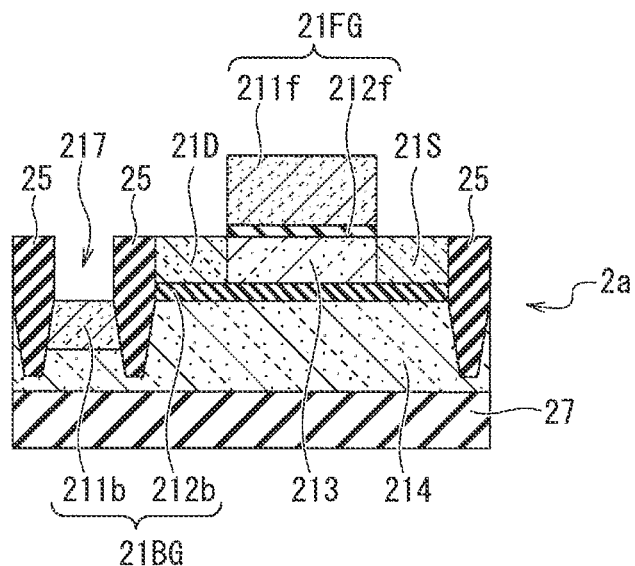
FIG. 14 is a manufacturing process cross-sectional view (Part 9) of the amplifier transistor provided in the solid-state image sensor according to the first embodiment of the present technology.

Next, as shown in FIG. 14, impurities are injected into the SOI substrate 2a to form high-concentration impurity regions in the silicon layer 213 exposed on both sides of the front gate unit 21FG and in the silicon substrate 214 exposed on the opening 217. If necessary, the high-concentration impurity region is activated by heat treatment. As a result, the source unit 21S is formed on one side of the front gate unit 21FG, and the drain unit 21D is formed on the other side. Further, the back gate electrode 211b is formed on the silicon substrate 214 exposed on the opening 217. As a result, a back gate unit 21BG is formed.

Figure 15:
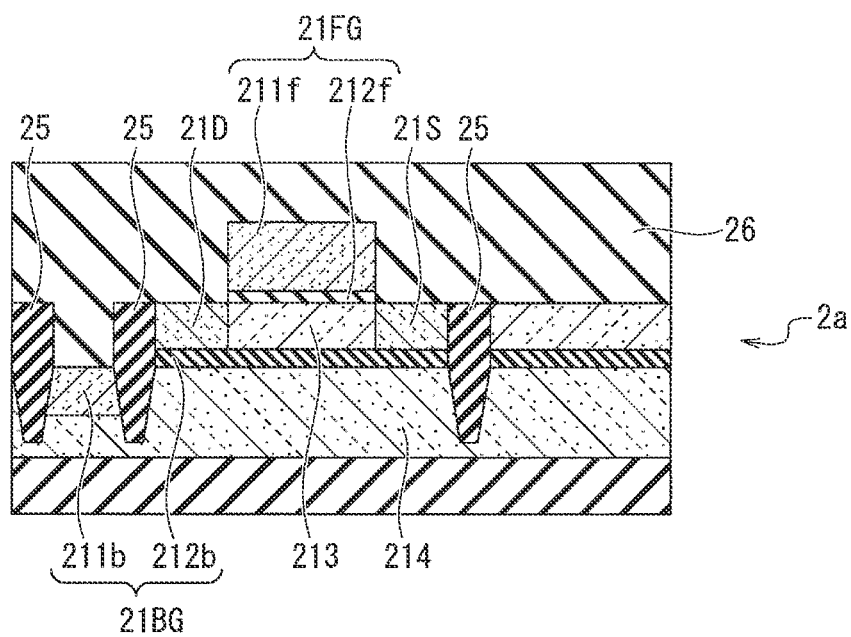
FIG. 15 is a manufacturing process cross-sectional view (Part 10) of the amplifier transistor provided in the solid-state image sensor according to the first embodiment of the present technology.

Next, as shown in FIG. 15, the interlayer insulating film 26 is formed on the SOI substrate 2a including the front gate unit 21FG and the back gate electrode 211b.

Figure 16:
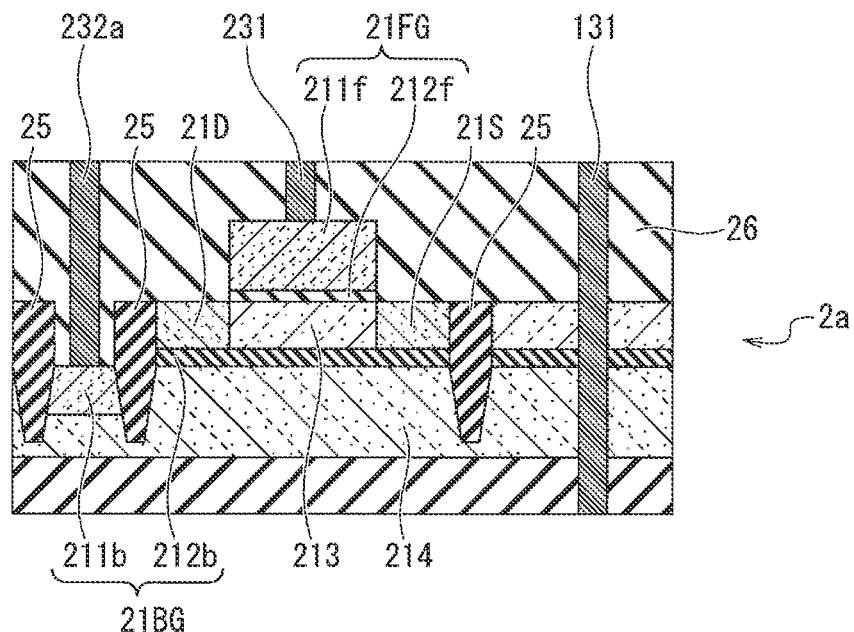
FIG. 16 is a manufacturing process cross-sectional view (Part 11) of the amplifier transistor provided in the solid-state image sensor according to the first embodiment of the present technology.

Next, as shown in FIG. 16, an opening exposing at least a part of the front gate electrode 211f, the back gate electrode 211b, and the FD unit 13 (see FIG. 2) is formed, and a metal electrode is formed in this opening. As a result, a connection wiring 231 connected to the front gate electrode 211f is formed, a connection wiring 232a connected to the back gate electrode 211b is formed, and the connection wiring 131 connected to the FD unit 13 is formed. Although not shown, an opening exposing at least a part of the source unit 21S and the drain unit 21D is formed, and a metal electrode is formed in this opening. As a result, it is possible to apply a predetermined voltage to one of the source unit 21S and the drain unit 21D, and output a predetermined voltage from the other.

Figure 17:
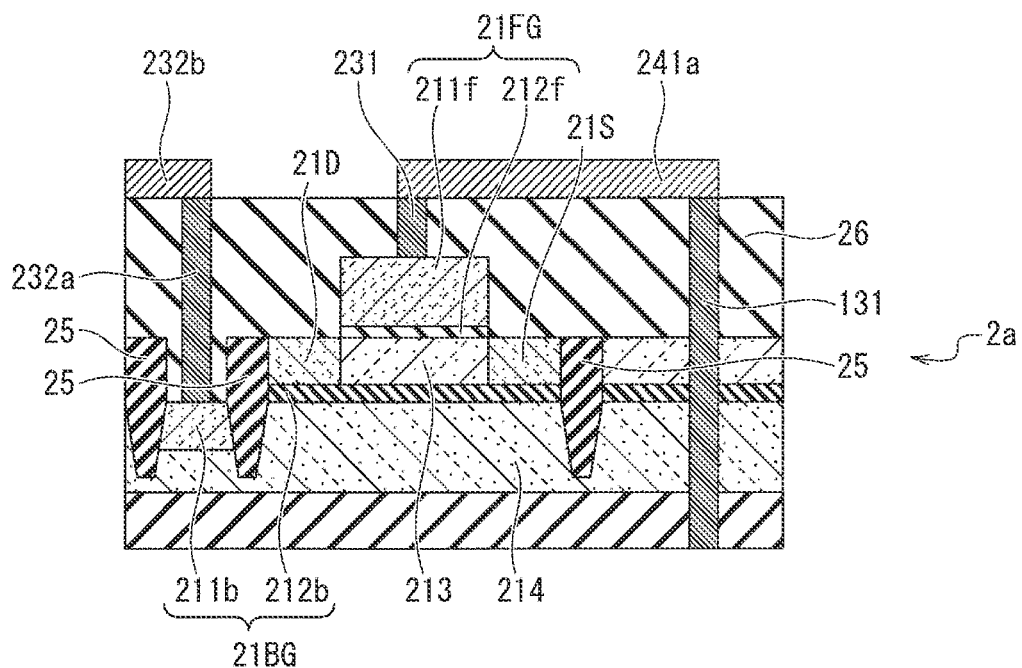
FIG. 17 is a manufacturing process cross-sectional view (Part 12) of the amplifier transistor provided in the solid-state image sensor according to the first embodiment of the present technology.

Next, a metal film is formed and patterned on the SOI substrate 2a including the interlayer insulating film 26 and the connection wirings 131, 231, and 232a. As a result, as shown in FIG. 17, a connection wiring 234a connecting the connection wiring 131 and the connection wiring 231 to each other is formed, and a connection wiring 234b connected to the connection wiring 232a is formed. Note that although not shown in FIG. 17, a connection wiring is formed on the drain unit 22D of the reset transistor 22 simultaneously with the connection wiring 231, and the connection wiring 232a is also connected to the connection wiring. As a result, the amplifier transistor 21 is completed. Thus, the amplifier transistor 21 can be formed without the use of a special manufacturing technology.

(Effects of Solid-State Image Sensor)

Next, the effects of the solid-state image sensor according to this embodiment will be described using FIG. 18 while referring to FIG. 5. "N×0" shown in FIG. 18 indicates a simulated image of the gradation display in the case where the back gate voltage VBG is not applied to the back gate unit 21BG. "N×2" shown in FIG. 18 indicates a simulated image of the gradation display in the case where the back gate voltage VBG is applied to the back gate unit 21BG so that the noise generated in the pixel is doubled. "N×3" shown in FIG. 18 indicates a simulated image of the gradation display in the case where the back gate voltage VBG is applied to the back gate unit 21BG so that the noise generated in the pixel is 3 times. "N×4" shown in FIG. 18 indicates a simulated image of the gradation display in the case where the back gate voltage VBG is applied to the back gate unit 21BG so that the noise generated in the pixel is 4 times.

As shown in FIG. 5, the back gate voltage VBG is applied to the back gate unit 21BG via the connection wiring 232a provided on the back gate electrode 211b. By applying the back gate voltage VBG to the back gate unit 21BG, the transconductance of the amplifier transistor 21 can be adjusted. The noise generated in the pixel provided in the solid-state image sensor IS1 can be expressed as a function of the transconductance of the amplifier transistor 21 and is proportional to the reciprocal of the transconductance. Therefore, it is possible to emphasize the noise generated in the pixel by applying the back gate voltage VBG to the back gate unit 21BG so that the transconductance of the amplifier transistor 21 is reduced, with respect to the pixel where noise is generated.

Although not described in detail, the solid-state image sensor IS1 is configured to eliminate the noise generated in the pixel by taking the difference between the signal level of the D-phase and the signal level of the P-phase to perform correlated double sampling (CDS). Here, the signal level of the D-phase is a signal level of the pixel signal based on the photoelectric conversion of the photoelectric conversion unit 11. The signal level of the P-phase is a signal level at the voltage at which the FD unit 13 has been reset to the power source VDD. For this reason, by emphasizing the noise generated in the pixel, the noise sensitivity in correlation double sampling is improved, and it is easy to remove the noise.

Figure 18:
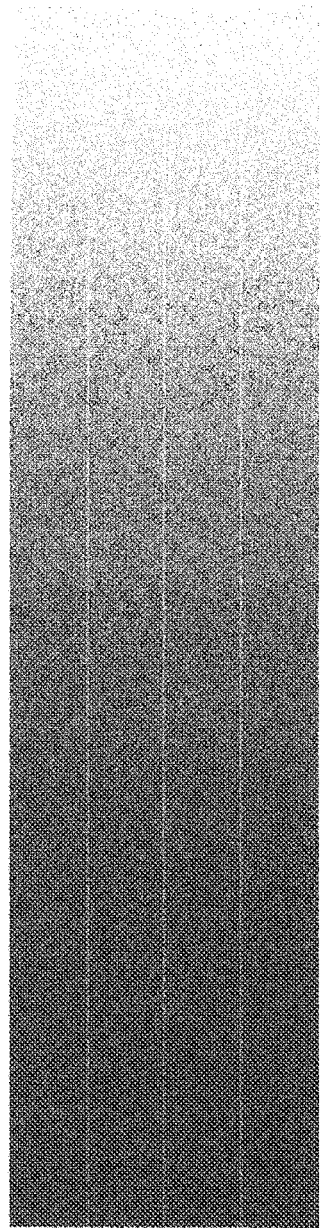
FIG. 18 is a diagram describing the effects of the solid-state image sensor according to the first embodiment of the present technology.

As shown by "N×0" in FIG. 18, even if correlation double sampling is used, the noise generated in the pixel cannot be removed, and a step-like gradation jump (banding) occurs in the image of the gradation display. Further, even if the back gate voltage VBG is applied to the back gate unit 21BG so that the noise generated in the pixel is doubled as shown by "N×2" in FIG. 18, a slight step-like gradation jump (banding) occurs in the image of the gradation display.

In contrast, as shown in "N×3" and "N×4" in FIG. 18, when the back gate voltage VBG is applied to the back gate unit 21BG so that the noise generated in the pixel is 3 times or 4 times, no step-like gradation jump (banding) occurs in the image of the gradation display. That is, the noise generated in the pixel is emphasized by the back gate voltage VBG, the sensitivity of the noise in the correlation double sampling is improved, and the noise generated in the pixel can be removed.

As described above, the solid-state image sensor IS1 according to this embodiment includes: the first substrate 1 that includes the photoelectric conversion unit 11, the transfer gate unit 12G connected to the photoelectric conversion unit 11, the FD unit 13 connected to the transfer gate unit 12G, and the interlayer insulating film 14 that covers the photoelectric conversion unit 11, the transfer gate unit 12G, and the FD unit 13; and the second substrate 2 that includes the amplifier transistor 21 and is disposed to be adjacent to the interlayer insulating film 14, the amplifier transistor 21 constituting a part of the pixel transistor connected to the FD unit 13 via the interlayer insulating film 14 and including the back gate unit 21BG.

The solid-state image sensor IS1 having this configuration is capable of adjusting the back gate voltage VBG applied to the back gate unit 21BG, thereby adjusting the noise generated in the pixel and preventing display unevenness of the captured image.

Second Embodiment

A solid-state image sensor according to the second embodiment of the present technology will be described with reference to FIG. 19 to FIG. 22. Note that components exhibiting the same effects and functions as those of the above-mentioned solid-state image sensor IS1 according to the first embodiment will be denoted by the same reference symbols, and description thereof will be omitted.

(Schematic Configuration of one Pixel of Solid-State Image Sensor)

Figure 19:
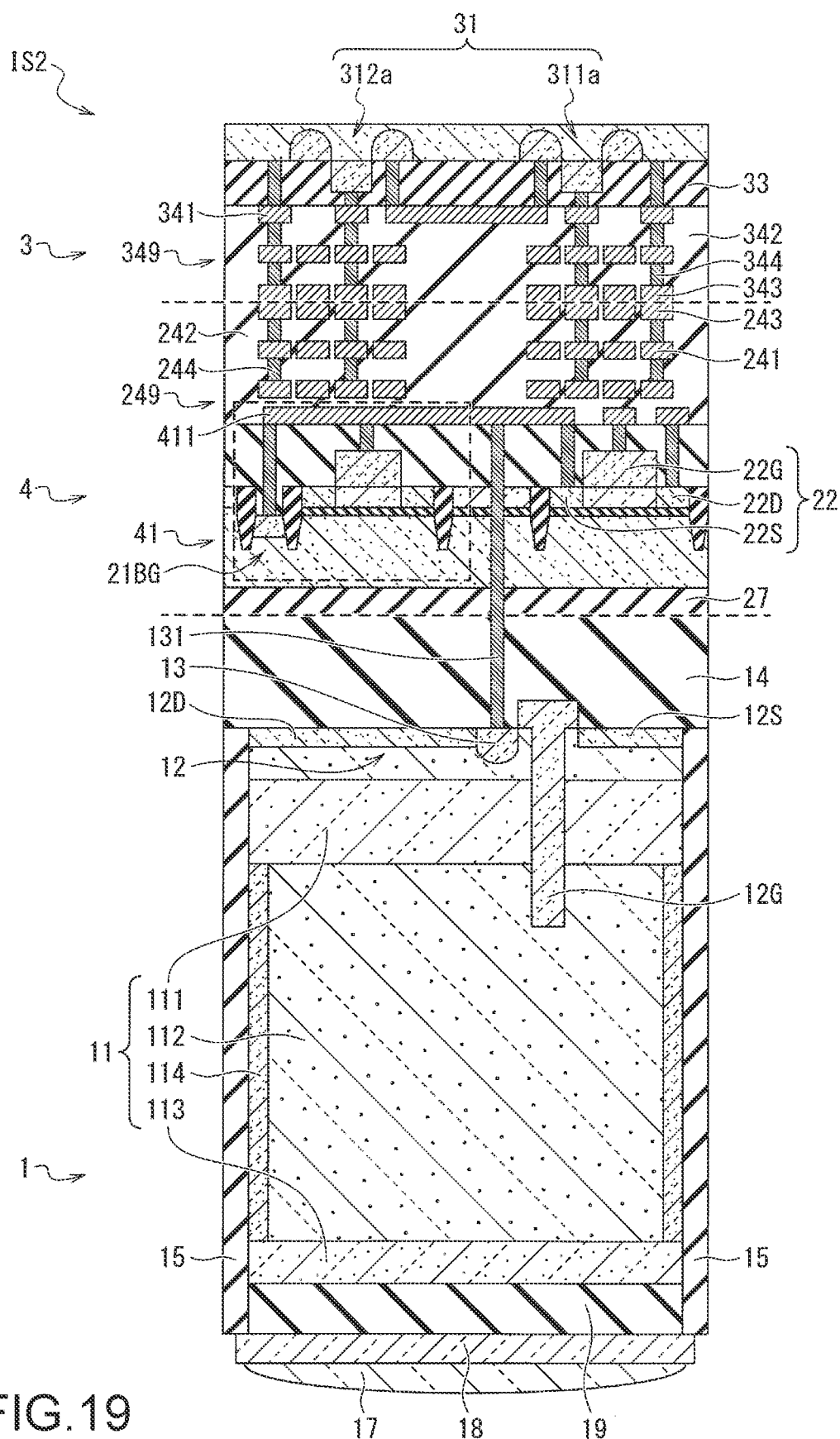
FIG. 19 is a cross-sectional view showing a schematic configuration of one pixel of a solid-state image sensor according to a second embodiment of the present technology.
Figure 20:
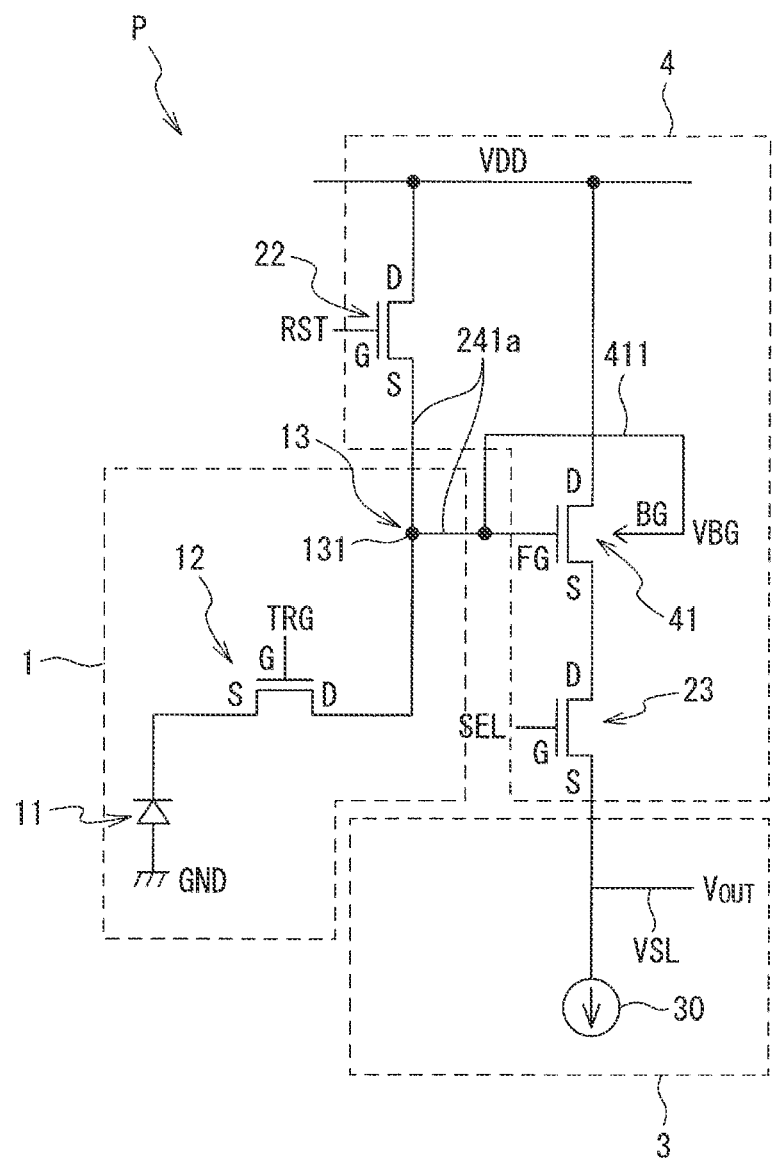
FIG. 20 is a diagram showing a circuit configuration example of the one pixel of the solid-state image sensor according to the second embodiment of the present technology.

A schematic configuration of one pixel of a solid-state image sensor IS2 according to this embodiment according to this embodiment will be described first with reference to FIG. 19. Note that in FIG. 20, the circuit configuration of one pixel P of the plurality of pixels is illustrated. Further, in FIG. 20, reference symbols of a gate unit, a source unit, and a drain unit of the transistors are respectively denoted by "G", "S", and "D". Further, reference symbols of a front gate unit, a back gate unit, a source unit, and a drain unit of the amplifier transistor are respectively denoted by "FG", "BG", "G", "S" and As shown in FIG. 19 and FIG. 20, the solid-state image sensor IS2 according to this embodiment includes: the first substrate 1 that includes the photoelectric conversion unit 11, the transfer gate unit 12G connected to the photoelectric conversion unit 11, the FD unit 13 connected to the transfer gate unit 12G, and the interlayer insulating film (an example of an insulating film) 14 that covers the photoelectric conversion unit 11, the transfer gate unit 12G, and the FD unit 13; and a second substrate 4 that includes an amplifier transistor 41 and is disposed to be adjacent to the interlayer insulating film 14, the amplifier transistor 41 constituting a part of the pixel transistor (an example of a circuit) connected to the FD unit 13 via the interlayer insulating film 14 and including the back gate unit 21BG.

Further, the amplifier transistor 41 provided on the second substrate 4 includes the front gate unit 21FG connected to the back gate unit 21BG. More specifically, the amplifier transistor 41 includes a connection wiring 411 that connects the back gate unit 21BG and the front gate unit 21FG to each other. The connection wiring 411 is also connected to the connection wiring 131 and the source unit 22S of the reset transistor 22. Thus, the connection wiring 411 is connected to the FD unit 13 via the connection wiring 131.

(Configuration of Pixel Transistor)

Figure 21:
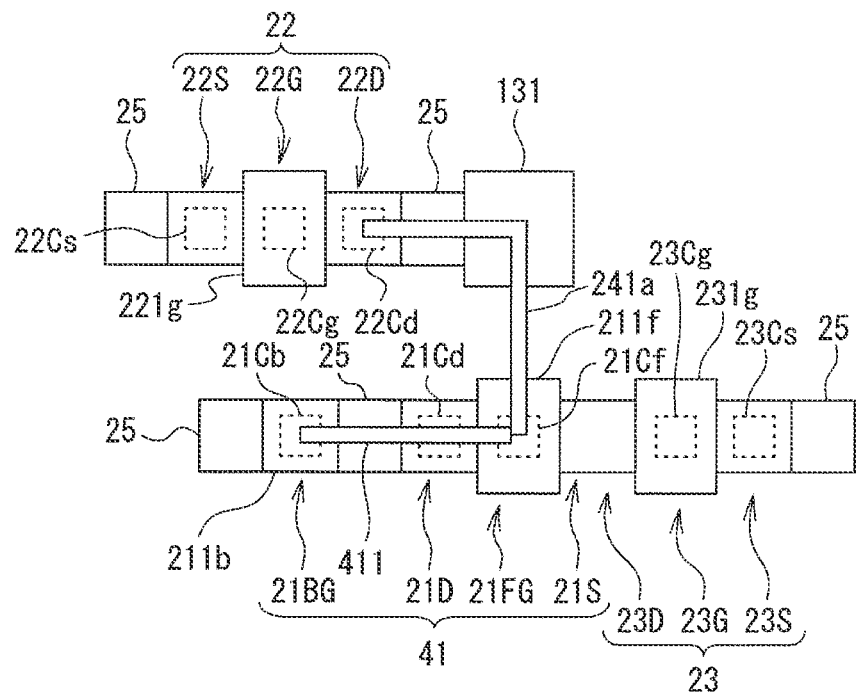
FIG. 21 is a diagram showing an example of wiring layout of a pixel transistor provided in the solid-state image sensor according to the second embodiment of the present technology.
Figure 22:
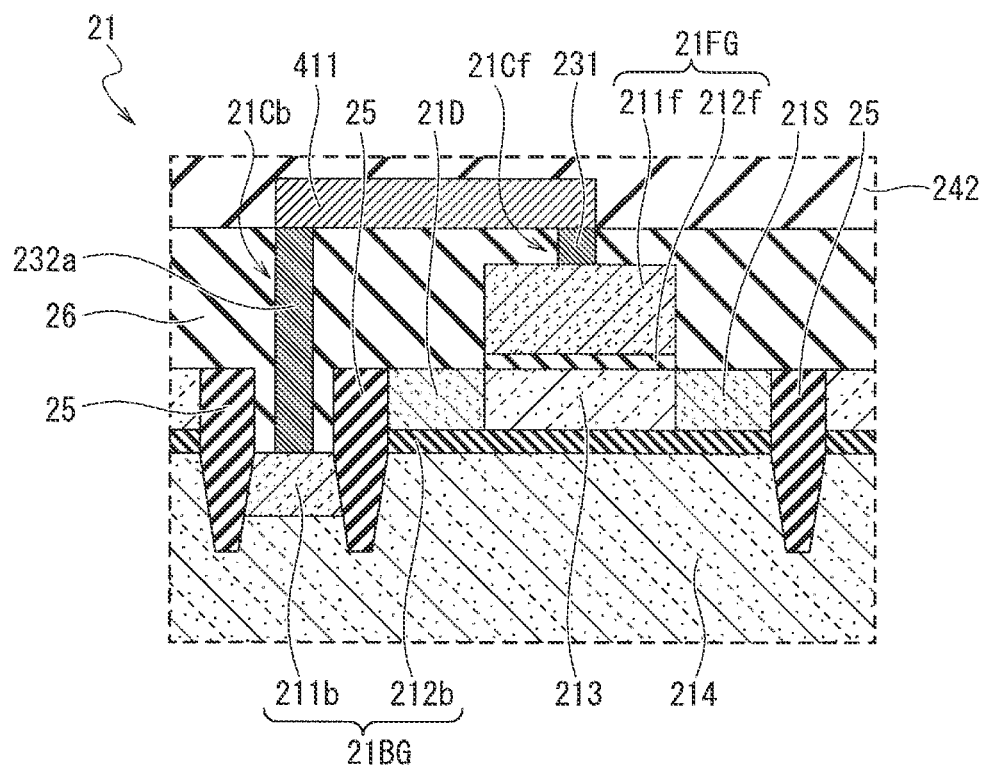
FIG. 22 is a cross-sectional view showing a schematic configuration of an amplifier transistor provided in the solid-state image sensor according to the second embodiment of the present technology.

Next, a configuration of a pixel transistor provided in the second substrate 4 will be described using FIG. 21 and FIG. 22. FIG. 21 illustrates wiring layout of a pixel transistor provided in the pixel P shown in FIG. 20. FIG. 22 shows a cross-sectional view of the amplifier transistor 41 provided in the pixel P shown in FIG. 20.

As shown in FIG. 21, in the solid-state image sensor IS2, the amplifier transistor 41 and the selection transistor 23 are disposed in a substantially straight line, similarly to the above-mentioned solid-state image sensor IS1 according to the first embodiment. Further, in the solid-state image sensor IS2, the amplifier transistor 41 and the selection transistor 23 are arranged in parallel with the reset transistor 22, similarly to the above-mentioned solid-state image sensor IS1 according to the first embodiment.

As shown in FIG. 21, the connection wiring 411 is disposed between the front gate unit 21FG of the amplifier transistor 41 and the back gate unit 21BG of the amplifier transistor 41. One end of the connection wiring 411 is connected to the front gate unit 21FG, and the other end of the connection wiring 411 is connected to the back gate unit 21BG.

More specifically, as shown in FIG. 22, one end of the connection wiring 411 is connected to the connection wiring 231 formed on the front gate electrode 211f. Further, the other end of the connection wiring 411 is connected to the connection wiring 232a formed on the back gate electrode 211b. Thus, the front gate electrode 211f and the back gate electrode 211b are electrically connected to each other via the connection wiring 231, the connection wiring 411, and the connection wiring 232a. As a result, a front gate unit FG of the amplifier transistor 41 is electrically connected to the back gate unit 21BG of the amplifier transistor 41.

As described above, the solid-state image sensor IS2 according to this embodiment has a configuration similar to that of the above-mentioned solid-state image sensor IS1 according to the first embodiment except that the amplifier transistor 41 includes the front gate unit 21FG connected to the back gate unit 21BG. The solid-state image sensor IS2 is capable of applying, to the back gate unit 21BG, the back gate voltage VBG of the same voltage as that of the front gate unit 21FG. As a result, the solid-state image sensor IS2 is capable of achieving effects similar to those of the above-mentioned solid-state image sensor IS1 according to the first embodiment.

Third Embodiment

A solid-state image sensor according to a third embodiment of the present technology will be described with reference to FIG. 23 to FIG. 26. Note that components exhibiting the same effects and functions as those of the above-mentioned solid-state image sensor IS1 according to the first embodiment are denoted by the same reference symbols, and description thereof is omitted.

(Schematic Configuration of one Pixel of Solid-State Image Sensor)

A schematic configuration of one pixel of a solid-state image sensor IS3 according to this embodiment will be described first with reference to FIG. 23 to FIG. 25. Note that in FIG. 24, the circuit configuration of one pixel P of the plurality of pixels is illustrated. Further, in FIG. 24, reference symbols of a gate unit, a source unit, and a drain unit of the transistors are respectively denoted by "G", "S", and "D". Further, reference symbols of a front gate unit, a back gate unit, a source unit, and a drain unit of the amplifier transistor are respectively denoted by "FG", "BG", "G", "S" and "D".

Figure 23:
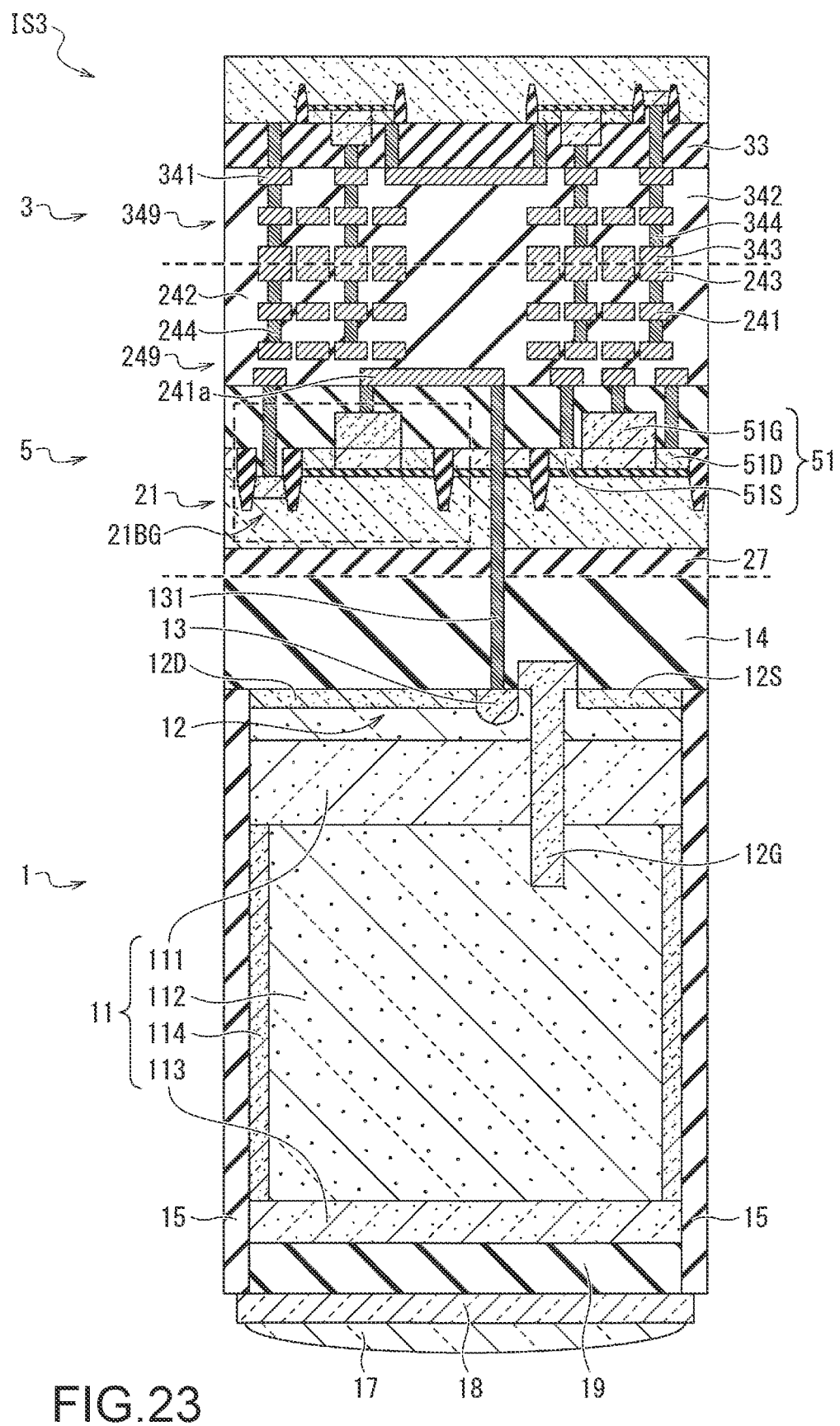
FIG. 23 is a diagram showing a circuit configuration example of one pixel of a solid-state image sensor according to a third embodiment of the present technology.

As shown in FIG. 23, the solid-state image sensor IS3 according to this embodiment includes: the first substrate 1 that includes the photoelectric conversion unit 11, the transfer gate unit 12G connected to the photoelectric conversion unit 11, the FD unit 13 connected to the transfer gate unit 12G, and the interlayer insulating film (an example of an insulating film) 14 that covers the photoelectric conversion unit 11, the transfer gate unit 12G, and the FD unit 13; and a second substrate 5 that includes the amplifier transistor 21 and is disposed to be adjacent to the interlayer insulating film 14, the amplifier transistor 21 constituting a part of the pixel transistor (an example of a circuit) connected to the FD unit 13 via the interlayer insulating film 14 and including the back gate unit 21BG.

Figure 24:
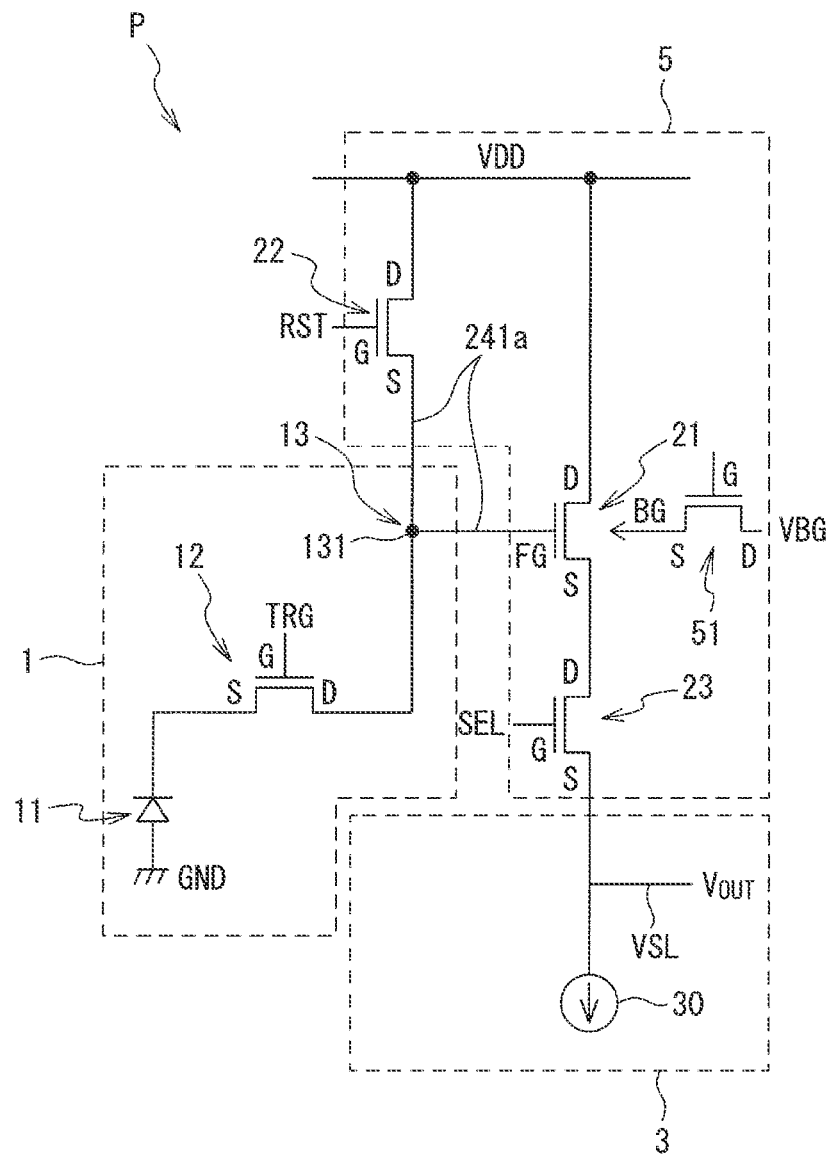
FIG. 24 is a diagram showing a circuit configuration example of one pixel of the solid-state image sensor according to the third embodiment of the present technology.

Further, as shown in FIG. 24, the second substrate 5 includes a switch unit 51 connected to the back gate unit 21BG of the amplifier transistor 21. A source unit 51S of the switch unit 51 is connected to the back gate unit 21BG. A drain unit 51D of the switch unit 51 is connected to an input terminal (not shown) to which the back gate voltage VBG is input. The input terminal is disposed in an input terminal unit provided on the third substrate 3. A gate unit 51G of the switch unit 51 is connected to an input terminal (not shown) to which a control signal for controlling the on/off state of the switch unit 51 is input. The control signal is generated in a logic circuit provided on the third substrate 3. When the switch unit 51 is turned on, the back gate unit 21BG and the drain unit 51D of the switch unit 51 are brought into conduction. As a result, the back gate voltage VBG input to the drain unit 21D is applied to the back gate unit 21BG.

Figure 25:
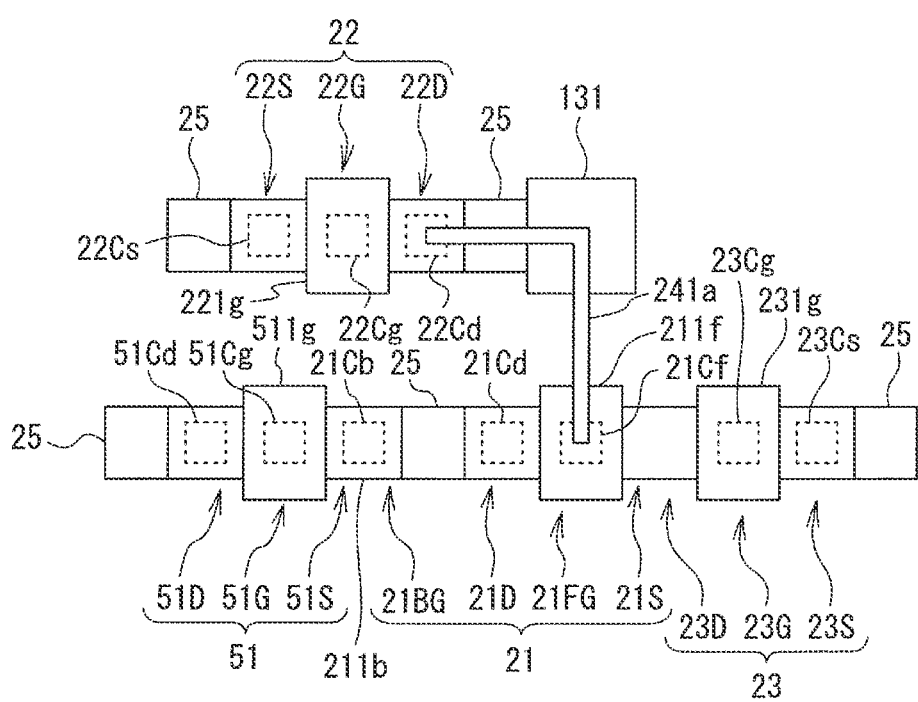
FIG. 25 is a diagram showing an example of wiring layout of a pixel transistor provided in the solid-state image sensor according to the third embodiment of the present technology.

As shown in FIG. 25, in the solid-state image sensor IS3, the amplifier transistor 21 and the selection transistor 23 are disposed in a substantially straight line, similarly to the above-mentioned solid-state image sensor IS1 according to the first embodiment. Further, in the solid-state image sensor IS3, the amplifier transistor 21 and the selection transistor 23 are disposed in parallel with the reset transistor 22, similarly to the above-mentioned solid-state image sensor IS1 according to the first embodiment. Further, in the solid-state image sensor IS3, the amplifier transistor 21, the selection transistor 23, and the switch unit 51 are disposed in a substantially straight line.

As shown in FIG. 25, the back gate unit 21BG of the amplifier transistor 21 and the source unit 51S of the switch unit 51 are connected to each other by being shared. More specifically, the back gate electrode 211b constituting the back gate unit 21BG and the source unit 51S are shared. The source unit 51S is disposed on one side of the gate unit 51G of the switch unit 51. The drain unit 51D is disposed on the other side of the gate unit 51G of the switch unit 51.

A contact region 51Cg having the same configuration as that of the contact region 21Cf is formed on a gate electrode 511g constituting the gate unit 51G of the switch unit 51. Thus, the gate unit 51G is connected to an input terminal to which the control signal for controlling the on/off of the switch unit 51 is input, and the voltage of the control signal can be applied thereto. A contact region 51Cd having the same configuration as that of the contact region 21Cf is formed on the drain unit 51D of the switch unit 51. Thus, the drain unit 51D is connected to an input terminal to which the back gate voltage VBG is input, and the back gate voltage VBG can be applied to the back gate unit 21BG via the switch unit 51.

(Control Timing of Switch Unit)

Figure 26:
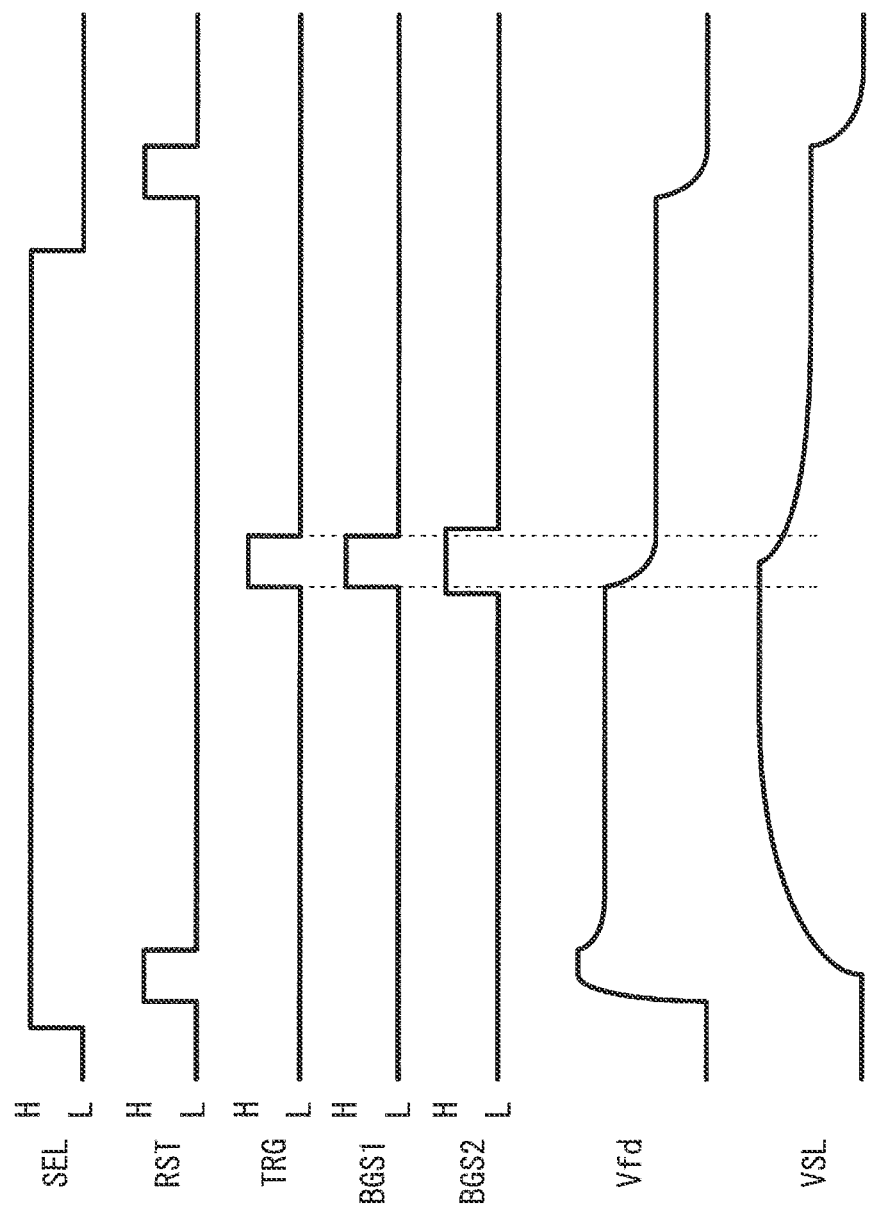
FIG. 26 is a timing chart showing control timing of a switch unit provided in the solid-state image sensor according to the third embodiment of the present technology.

Next, the control timing of the switch unit 51 provided in the solid-state image sensor IS3 according to this embodiment will be described with reference to FIG. 26. In FIG. 26, "SEL" indicates the drive signal SEL, "RST" indicates the drive signal RST, and "TRG" indicates the drive signal TRG. "BGS1" shown in FIG. 26 indicates a first example of the control signal input to the gate unit 51G of the switch unit 51, and "BGS2" shown in FIG. 26 indicates a second example of the control signal input to the gate unit 51G of the switch unit 51. "Vfd" shown in FIG. 26 indicates the voltage of the FD unit 13. "VSL" shown in FIG. 26 indicates the pixel signal Vout output to the signal line VSL. "H" shown in FIG. 26 indicates that the signal level is at a high level, and "L" shown in FIG. 26 indicates that the signal level is at a low level. The lapse of time is shown from left to right in FIG. 26.

As shown in FIG. 26, the control signal input to the gate unit 51G of the switch unit 51 may be input to the gate unit 51G at the same timing as that of a drive signal TGR input to the transfer gate unit 12G of the transfer transistor 12 (first example). Alternatively, the control signal input to the gate unit 51G of the switch unit 51 may reach a high level slightly earlier than the drive signal TGR input to the transfer gate unit 12G of the transfer transistor 12, and may be input to the gate unit 51G at the timing when reaching a low level, which is slightly later than the drive signal TGR (second example). Therefore, at any of the control timings of the first example and the second example, the switch unit 51 is turned on when the transfer gate unit 12G is turned on.

As described above, the solid-state image sensor IS3 according to this embodiment has a configuration similar to that of the above-mentioned solid-state image sensor IS1 according to the first embodiment except that it includes the switch unit 51. In the solid-state image sensor IS3, the switch unit 51 is in the on state when the transfer gate unit 12G is in the on state, so that the back gate voltage VBG can be applied to the back gate unit 21BG. As a result, the solid-state image sensor IS3 is capable of achieving effects similar to those of the above-mentioned solid-state image sensor IS1 according to the first embodiment.

Fourth Embodiment

A solid-state image sensor according to a fourth embodiment of the present technology will be described with reference to FIG. 27 to FIG. 30. Note that components exhibiting the same effects and functions as those of the above-mentioned solid-state image sensor IS1 according to the first embodiment are denoted by the same reference symbols, and description thereof is omitted.

Schematic Configuration of one Pixel of Solid-State Image Sensor)

Figure 27:
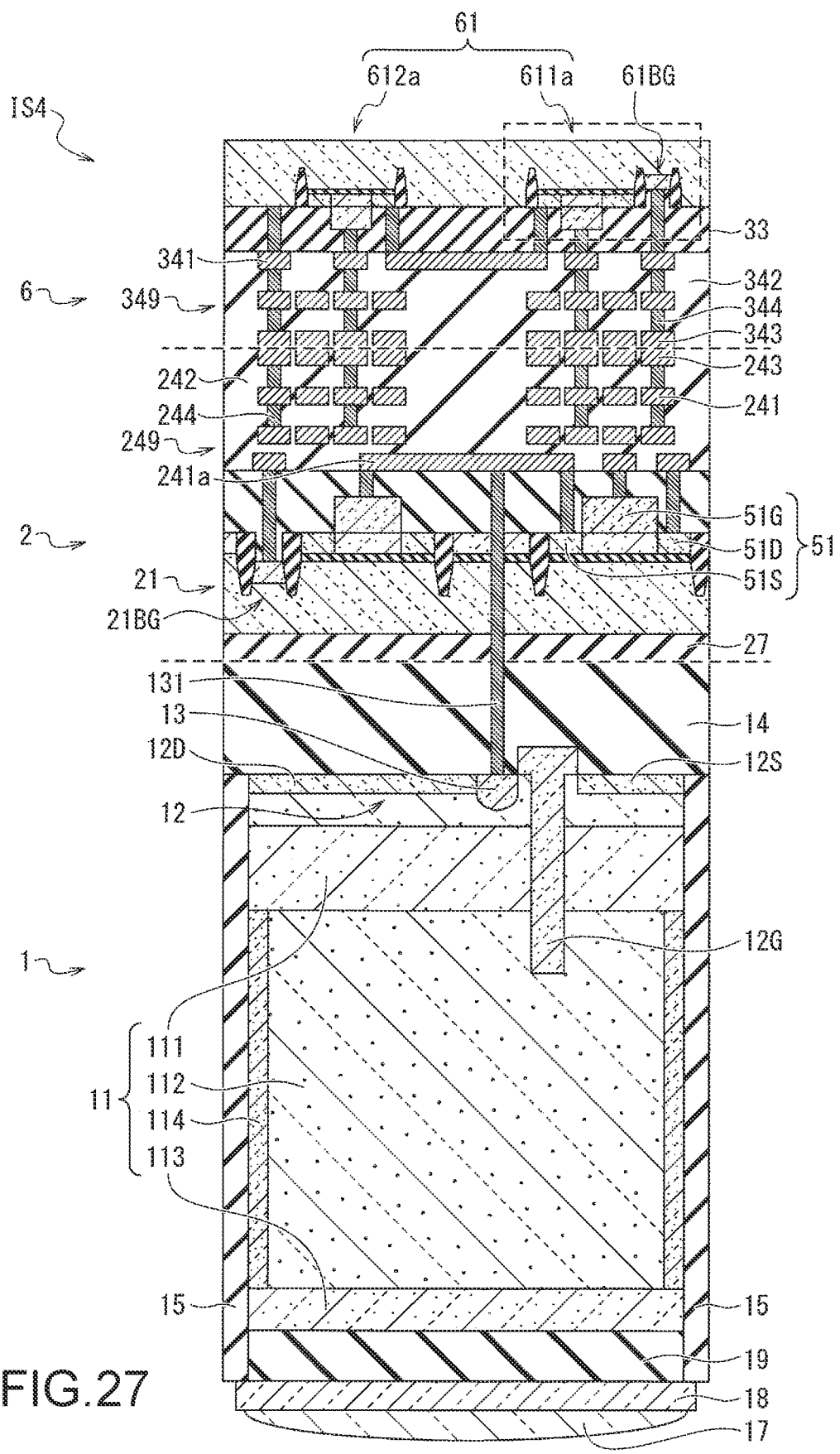
FIG. 27 is a cross-sectional view showing a schematic configuration of one pixel of a solid-state image sensor according to a fourth embodiment of the present technology.

As shown in FIG. 27, a solid-state image sensor IS4 according to this embodiment includes: the first substrate 1 that includes the photoelectric conversion unit 11, the transfer gate unit 12G connected to the photoelectric conversion unit 11, the FD unit 13 connected to the transfer gate unit 12G, and the interlayer insulating film (an example of an insulating film) 14 that covers the photoelectric conversion unit 11, the transfer gate unit 12G, and the FD unit 13; and the second substrate 2 that includes the amplifier transistor 21 and is disposed to be adjacent to the interlayer insulating film 14, the amplifier transistor 21 constituting a part of the pixel transistor (an example of a circuit) connected to the FD unit 13 via the interlayer insulating film 14 and including the back gate unit 21BG.

Further, the solid-state image sensor IS4 according to this embodiment is disposed to be adjacent to the second substrate 2, and includes a third substrate 6 that includes a back gate unit 61BG (an example of a back gate), a comparator circuit 61 having a MOSFET 611a (an example of a transistor) of a SOI structure being formed on the third substrate 6. The comparator circuit 61 is a part of the circuit constituting the logic circuit provided on the third substrate 6. The comparator circuit 61 is disposed to face the stacked unit 349 via an interlayer insulating film 33.

(Configuration of Comparator Circuit)

Figure 28:
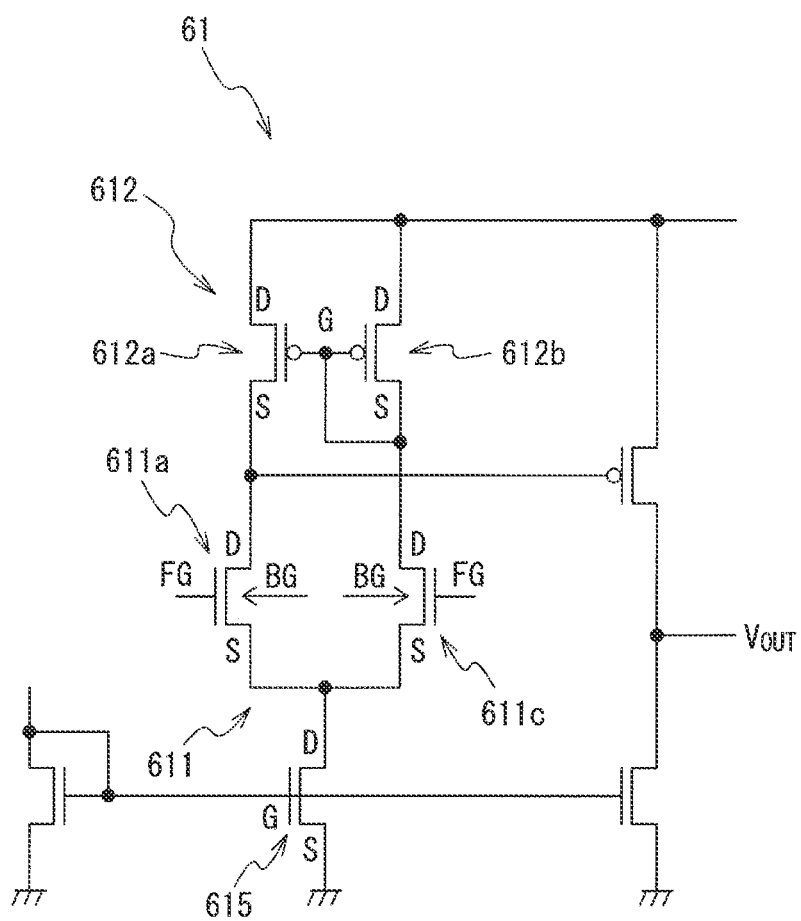
FIG. 28 is a diagram showing a circuit configuration example of a comparator circuit provided in the solid-state image sensor according to the fourth embodiment of the present technology.
Figure 29:
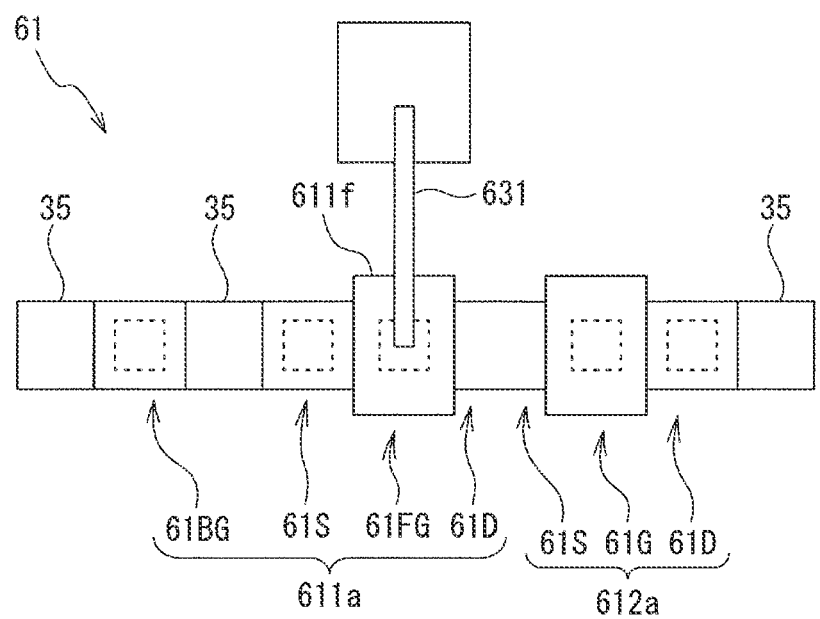
FIG. 29 is a diagram showing an example of wiring layout of the comparator circuit provided in the solid-state image sensor according to the fourth embodiment of the present technology.

Next, a configuration of the comparator circuit 61 provided on the third substrate 6 will be described using FIG. 28 and FIG. 29. FIG. 29 illustrates wiring layout of a part of the comparator circuit 61. In FIG. 28, reference symbols of a gate unit, a source unit, and a drain unit of the transistors constituting the comparator circuit 61 are respectively denoted by "G", "S", and "D". Further, reference symbols of a front gate unit, a back gate unit, a source unit, and a drain unit of the amplifier transistor are respectively denoted by "FG", "BG", "G", "S", and "D".

As shown in FIG. 28, the comparator circuit 61 includes a differential input circuit 611, a current mirror circuit 612 connected to the differential input circuit 611, and a tail current source 615. The differential input circuit 611 includes the MOSFETs 611a and 611c including the back gate unit 61BG. The MOSFETs 611a and 611c each include an N-type MOSFET. The current mirror circuit 612 includes P-type MOSFETs 612a and 612c. The tail current source 615 includes an N-type MOSFET.

The MOSFET 611a of the differential input circuit 611 constitutes a non-inverting input terminal (+), and the MOSFET 611c constitutes an inverting input terminal (−). A front gate unit 61FG of the MOSFET 611a is connected to the signal line VSL connected to the source unit 22S (not shown in FIG. 27, see FIG. 3) of the selection transistor 23. A reference signal (e.g., a ramp signal) is input to the front gate unit 61FG of the MOSFET 611c. The comparator circuit 61 is configured to compare the signal levels of the pixel signal and the reference signal input via the signal line VSL with each other, and output, when the signal level of the pixel signal is higher than the signal level of the reference signal, an output signal Vout of a low signal level. The ADC including the comparator circuit 61 is configured to convert the analog pixel signal into a digital pixel signal on the basis of the counter value when the signal level of the output signal Vout is low.

As shown in FIG. 29, a source unit 61S is disposed on one side of a front gate unit FG61 of the MOSFET 611a of the differential input circuit 611, and a drain unit 61D is disposed on the other side. The back gate unit 61BG is disposed to be adjacent to the side where the front gate unit 61FG of the source unit 61S of the MOSFET 611a is not provided, via an element separation region 35. A connection wiring 631 for connecting to the signal line VSL is formed on the front gate unit 61FG.

The source unit 61S is disposed on one side of a gate unit 61G of the MOSFET 612a constituting the current mirror circuit 612, and the drain unit 61D is disposed on the other side. The source unit 61S of the MOSFET 612a and the drain unit 61D of the MOSFET 611a are shared.

(Configuration of MOSFET of Differential Input Circuit 611)

Next, a configuration of the MOSFET 611a of the differential input circuit 611 provided in the solid-state image sensor IS4 according to this embodiment will be described using FIG. 30.

Figure 30:
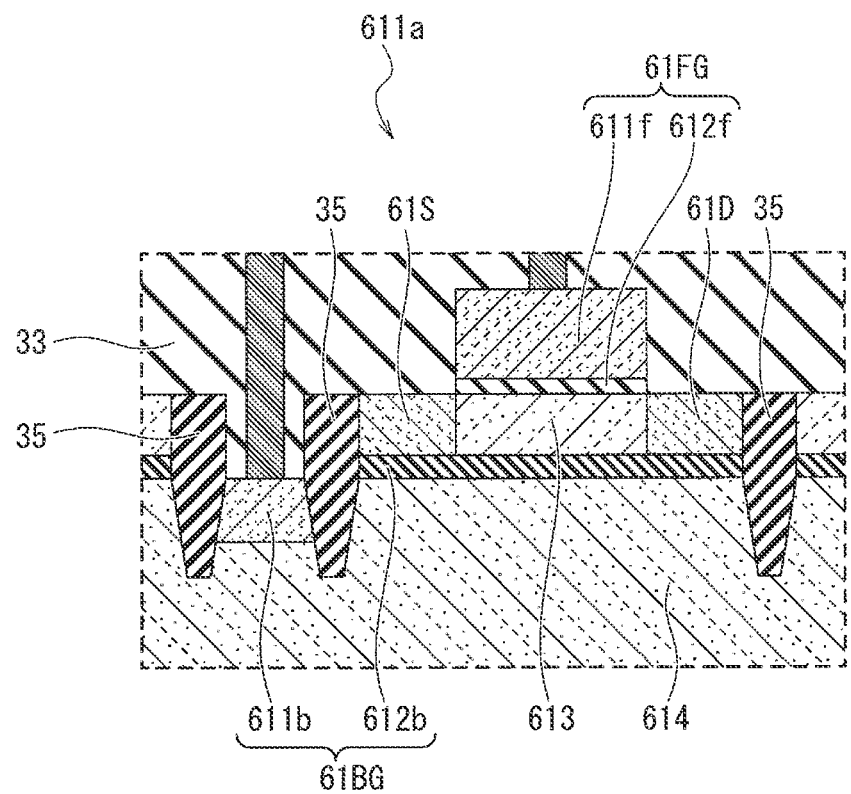
FIG. 30 is a cross-sectional view showing a schematic configuration of a MOSFET constituting the comparator circuit provided in the solid-state image sensor according to the fourth embodiment of the present technology.

As shown in FIG. 30, the MOSFET 611a includes a P-type silicon substrate 614, a back gate insulating film 612b formed on the silicon substrate 614, and a silicon layer 613 formed on the back gate insulating film 612b. As described above, the MOSFET 611a has a SOI structure including the silicon layer 613 on the back gate insulating film 612b. The back gate insulating film 212b includes, for example, a buried oxide film (BOX: Buried Oxide). The silicon layer 613 includes a P-type silicon film having an impurity concentration of, for example, $5 \times 10^{17}$ to $1 \times 10^{20}$ (/cm$^3$).

Further, the MOSFET 611a includes the front gate unit 61FG formed on the silicon layer 613. The MOSFET 611a includes the source unit 61S formed on the silicon layer 613 on one side of the front gate unit 61FG, and the drain unit 61D formed in the silicon layer 613 on the other side. The front gate unit 61FG includes a front gate insulating film 612f formed in the silicon layer 613, and a front gate electrode 611f formed on the front gate insulating film 612f.

The MOSFET 611a includes a back gate electrode 611b formed in the silicon substrate 614. The back gate electrode 611b includes a high-concentration impurity region formed on the silicon substrate 614. The back gate electrode 611b is separated from the source unit 61S by the element separation region 35. The back gate electrode 611b and the back gate insulating film 612b constitute the back gate unit 61BG. Although not shown, the MOSFET 611c of the differential input circuit 611 has the same configuration as that of the MOSFET 611a.

In the solid-state image sensor IS4 according to this embodiment, the back gate voltage VBG applied to each of the back gate units 61BG of the MOSFETs 611a and 611c constituting the differential input unit of the differential input circuit 611 of the comparator circuit 61 provided for each pixel may be adjusted. Further, in the solid-state image sensor IS4 according to this embodiment, the back gate voltage VBG applied to each of the back gate units 61BG of the MOSFETs 611a and 611c of the differential input circuit 611 may be adjusted for each pixel included in the predetermined area.

The transconductance of the MOSFETs 611a and 611c can be adjusted by adjusting the back gate voltage VBG applied to each of the back gate units 61BG of the MOSFETs 611a and 611c constituting the differential input unit of the differential input circuit 611 of the comparator circuit 61. As a result, the noise of the ADC provided on the third substrate 6 is adjusted. As a result, the solid-state image sensor IS4 is capable of preventing display unevenness of the captured image.

As described above, the solid-state image sensor IS4 according to this embodiment has a configuration similar to that of the above-mentioned solid-state image sensor IS1 according to the first embodiment except that the MOSFETs 611a and 611c including the back gate unit 61BG are provided in the comparator circuit 61. As a result, the solid-state image sensor IS4 is capable of adjusting the noise of the ADC in addition to adjusting the noise generated in the pixel similarly to the above-mentioned solid-state image sensor IS1 according to the first embodiment, and thus is capable of more effectively preventing display unevenness of the captured image.

Modified Example of Fourth Embodiment

A solid-state image sensor according to a modified example of a fourth embodiment of the present technology will be described using FIG. 2 again as well as FIG. 31. Note that components exhibiting the same effects and functions as those of the above-mentioned solid-state image sensor IS1 according to the first embodiment are denoted by the same reference symbols, and description thereof is omitted.

The solid-state image sensor according to this modified example includes the third substrate 3 that includes the back gate unit 61BG (an example of a back gate) and is disposed to be adjacent to the second substrate 2, the comparator circuit 31 including a MOSFET 311a (an example of a transistor) of a bulk-silicon structure being formed on the third substrate 3. The comparator circuit 31 is a part of the circuit constituting the logic circuit provided on the third substrate 3. The comparator circuit 31 is disposed to face the stacked unit 349 via the interlayer insulating film 33.

Further, the comparator circuit 31 may have a configuration similar to that of the comparator circuit 61 except that it does not include a back gate unit. As shown in FIG. 2, the comparator circuit 31 includes a differential input circuit, a current mirror circuit connected to the differential input circuit, and a tail current source. The differential input circuit includes two MOSFETs that include no back gate unit. FIG. 2 illustrates the MOSFET 311a that is one of the two MOSFETs. The two MOSFETs each include an N-type MOSFET. The current mirror circuit includes two P-type MOSFETs. FIG. 2 illustrates a MOSFET 312a that is one of the two MOSFETs. The tail current source includes an N-type MOSFET.

(Configuration of Comparator Circuit 31)

Figure 31:
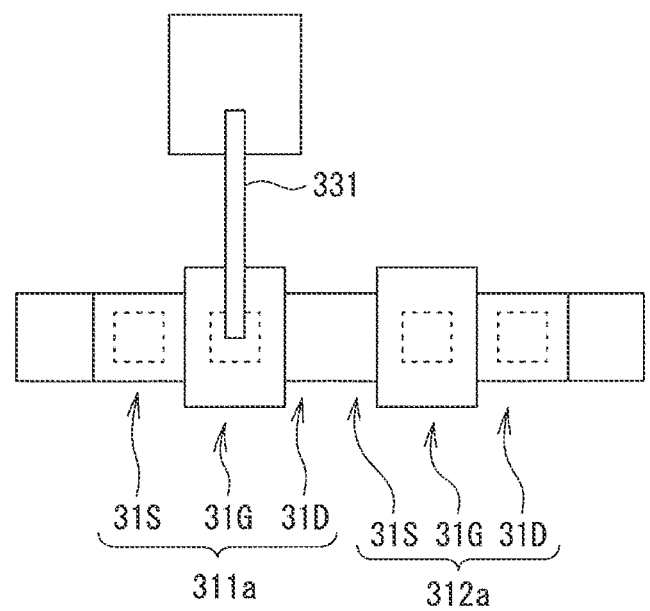
FIG. 31 is a diagram showing an example of wiring layout of the comparator circuit provided in the solid-state image sensor according to the fourth embodiment of the present technology.

As shown in FIG. 31, a source unit 31S is disposed on one side of a gate unit 31G of the MOSFET 311a of the differential input circuit provided in the comparator circuit 31 according to this modified example, and a drain unit 31D is disposed on the other side. A connection wiring 331 for connecting to the signal line VSL is formed on the gate unit 31G of the MOSFET 311a.

The source unit 31S is disposed on one side of the gate unit 31G of the MOSFET 312a constituting the current mirror circuit provided in the comparator circuit 31 according to this modified example, and the drain unit 31D is disposed on the other side. The source unit 31S of the MOSFET 312a and the drain unit 31D of the MOSFET 311a are shared.

As described above, since the solid-state image sensor according to this modified example has a configuration similar to that of the solid-state image sensor IS1 according to the first embodiment, effects similar to those of the above-mentioned solid-state image sensor IS1 according to the first embodiment can be achieved.

Fifth Embodiment

A solid-state image sensor according to a fifth embodiment of the present technology will be described using FIG. 5 again. The solid-state image sensor according to this embodiment is characterized in that a back gate insulating film constituting a back gate unit of an amplifier transistor and a front gate insulating film constituting a front gate unit of the amplifier transistor have different film types or different film structures.

As shown in FIG. 5, the back gate unit 21BG provided in the solid-state image sensor according to this embodiment includes the back gate electrode 211b and the back gate insulating film 212b. Further, the front gate unit 21FG provided in the solid-state image sensor according to this embodiment includes the front gate electrode 211f and the front gate insulating film 212f. The back gate insulating film 212b and the front gate insulating film 212f have different film types or different film structures.

In this embodiment, unlike the film structure of the front gate insulating film 212f, the back gate insulating film 212b may include a stacked film of HK and $SiO_2$ having high defect densities. Further, unlike the film type of the front gate insulating film 212f, the back gate insulating film 212b may be formed of SiN having a high defect density.

The higher the defect density of the back gate insulating film 212b of the amplifier transistor 21, the more the noise generated in the pixel. As a result, since the noise sensitivity in the correlation double sampling is improved, the solid-state image sensor according to this embodiment is capable of easily removing the noise generated in the pixel. As a result, the solid-state image sensor according to this embodiment is capable of achieving effects similar to those of the above-mentioned solid-state image sensor IS1 according to the first embodiment.

Sixth Embodiment

A solid-state image sensor according to a sixth embodiment of the present technology will be described using FIG. 5 again. The solid-state image sensor according to this embodiment is characterized in that a back gate insulating film constituting a back gate unit of an amplifier transistor and a front gate insulating film constituting a front gate unit of the amplifier transistor have different film quality.

As shown in FIG. 5, the back gate unit 21BG provided in the solid-state image sensor according to this embodiment includes the back gate electrode 211b and the back gate insulating film 212b. Further, the front gate unit 21FG provided in the solid-state image sensor according to this embodiment includes the front gate electrode 211f and the front gate insulating film 212f. The back gate insulating film 212b and the front gate insulating film 212f have different film quality.

In this embodiment, unlike the film quality of the back gate insulating film 212b, the front gate insulating film 212f may be formed of $SiO_2$ having a low defect level by hydrogen-supply annealing or the like.

The fact that the front gate insulating film 212f of the amplifier transistor 21 has film quality having a defect level lower than that of the back gate insulating film 212b is equivalent to the fact that the back gate insulating film 212b has a defect level higher than that of the front gate insulating film 212f. Therefore, when the front gate insulating film 212f of the amplifier transistor 21 has film quality having a defect level lower than that of the back gate insulating film 212b, the noise generated in the pixel is increased. As a result, since the noise sensitivity in the correlation double sampling is improved, the solid-state image sensor according to this embodiment is capable of easily removing the noise generated in the pixel. As a result, the solid-state image sensor according to this embodiment is capable of achieving effects similar to those of the above-mentioned solid-state image sensor IS1 according to the first embodiment.

In the present technology, the back gate insulating film constituting the back gate unit of the amplifier transistor and the front gate insulating film constituting the front gate unit of the amplifier transistor may have different film types or different film structures, and the back gate insulating film constituting the back gate unit of the amplifier transistor and the front gate insulating film constituting the front gate unit of the amplifier transistor may have different film quality. In this case, the film type or film structure and the film quality need to be different so that the defect level of the back gate insulating film is higher than the defect level of the front gate insulating film.

Seventh Embodiment

Figure 32:
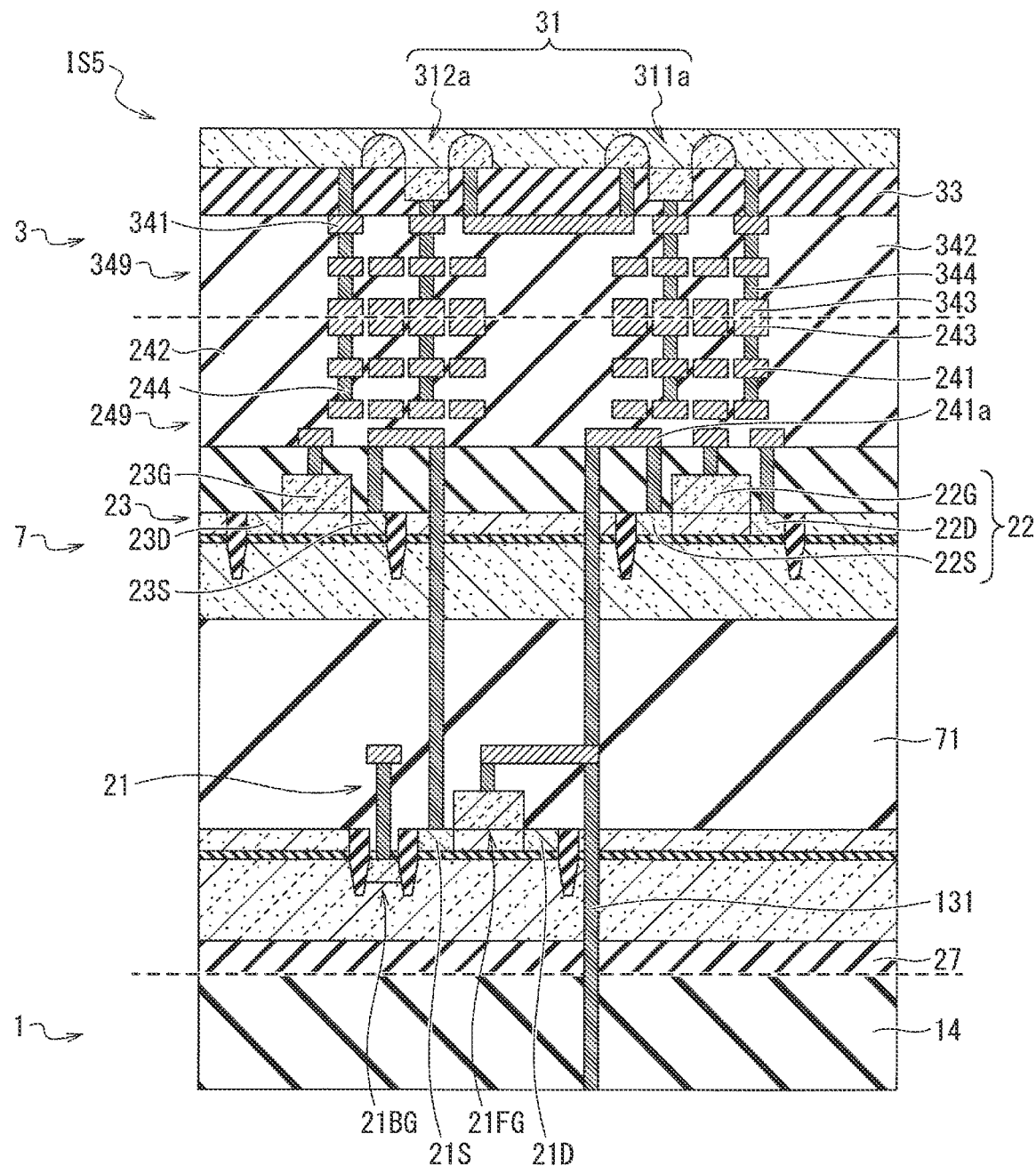
FIG. 32 is a diagram showing a circuit configuration example of one pixel of a solid-state image sensor according to a seventh embodiment of the present technology.

A solid-state image sensor according to a seventh embodiment of the present technology will be described with reference to FIG. 32. In FIG. 32, illustration except for the interlayer insulating film 14 of the first substrate 1 having the same configuration as that of the first substrate 1 provided in the above-mentioned solid-state image sensor IS1 according to the first embodiment is omitted. Note that components exhibiting the same effects and functions as those of the above-mentioned solid-state image sensor IS1 according to the first embodiment are denoted by the same reference symbols, and description thereof is omitted.

As shown in FIG. 32, a second substrate 7 provided in a solid-state image sensor IS5 according to this embodiment includes the reset transistor 22 (an example of a second transistor) and the selection transistor 23 (an example of a second transistor) constituting a pixel transistor (an example of a circuit). Further, the solid-state image sensor IS5 includes the amplifier transistor 21 (an example of a first transistor), and an interlayer insulating film 71 formed between the reset transistor 22 and the selection transistor 23.

The solid-state image sensor IS5 is capable of reducing the noise level at the time of the high-bit operation by having a stacked structure of the amplifier transistor 21, the reset transistor 22, and the selection transistor 23 as described above. Further, the solid-state image sensor IS5 has a stacked structure of the amplifier transistor 21, and the reset transistor 22, and the selection transistor 23, whereby the degree of freedom in designing the pixel transistor can be improved.

Further, since the solid-state image sensor IS5 includes the amplifier transistor 21 having the same configuration as that of the amplifier transistor 21 provided in the above-mentioned solid-state image sensor IS1 according to the first embodiment, effects similar to those of the above-mentioned solid-state image sensor IS1 according to the first embodiment can be achieved.

Eighth Embodiment

Figure 33:
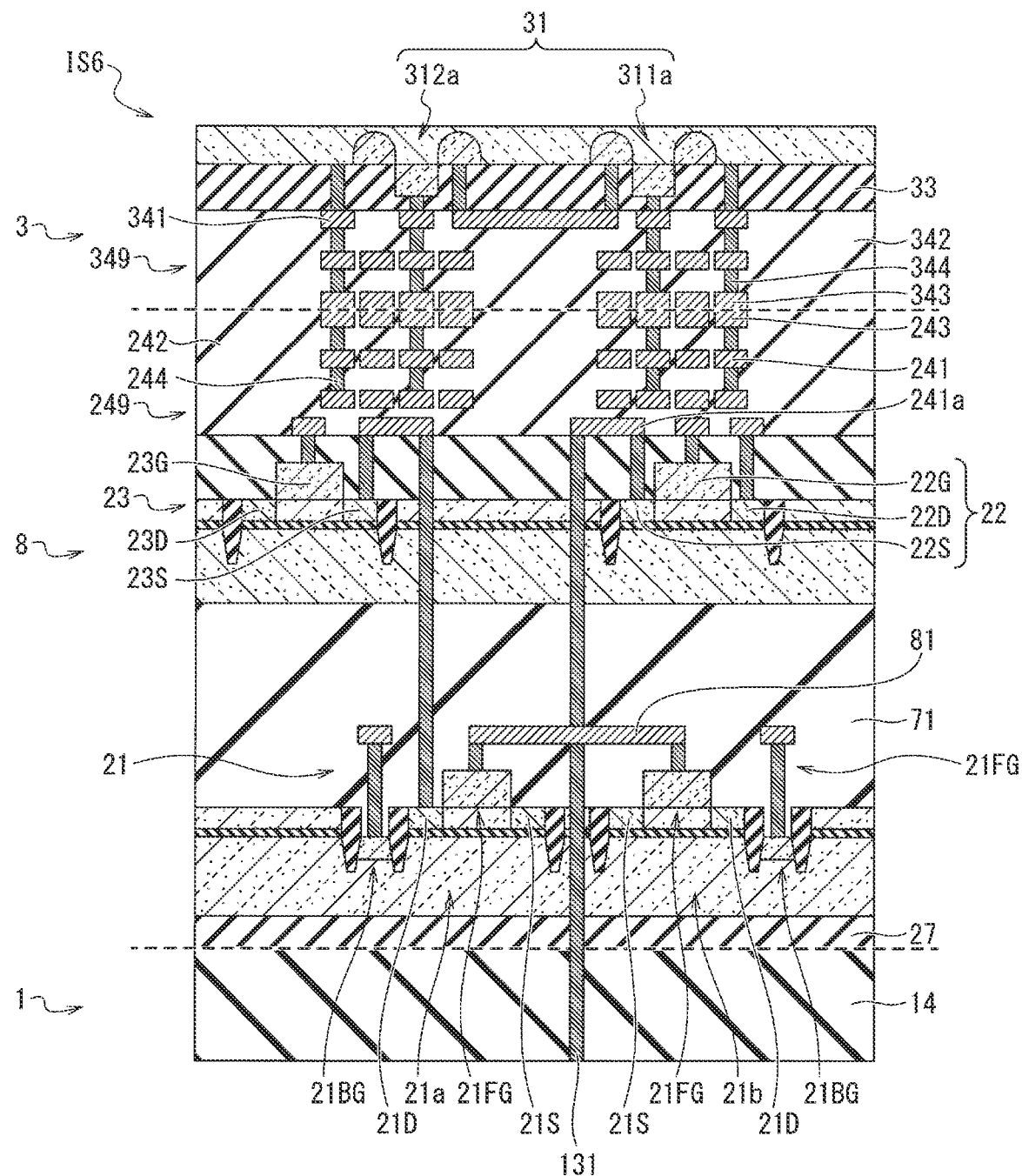
FIG. 33 is a diagram showing a circuit configuration example of one pixel of a solid-state image sensor according to an eighth embodiment of the present technology.

A solid-state image sensor according to an eighth embodiment of the present technology will be described with reference to FIG. 33. In FIG. 33, illustration except for the interlayer insulating film 14 of the first substrate 1 having the same configuration as that of the first substrate 1 provided in the above-mentioned solid-state image sensor IS1 according to the first embodiment is omitted. Note that components exhibiting the same effects and functions as those of the above-mentioned solid-state image sensor IS1 according to the first embodiment are denoted by the same reference symbols, and description thereof is omitted.

As shown in FIG. 33, a second substrate 8 provided in a solid-state image sensor IS6 according to this embodiment includes the reset transistor 22 (an example of a second transistor) and the selection transistor 23 (an example of a second transistor) constituting a part of a pixel transistor (example of a circuit). Further, the solid-state image sensor IS6 includes the amplifier transistor 21 (an example of a first transistor), and the interlayer insulating film 71 formed between the reset transistor 22 and the selection transistor 23.

Further, the second substrate 8 provided in the solid-state image sensor IS6 includes a plurality of (two in this embodiment) amplifier transistors 21a and 21b. The front gate units FG (an example of a front gate) are provided to be connectable to each other in at least a part (all in this embodiment) of the plurality of amplifier transistors 21a and 21b. In the solid-state image sensor IS6 shown in FIG. 33, the front gate unit 21FG of the amplifier transistor 21a and the front gate unit 21FG of the amplifier transistor 21a are connected to each other by a connection wiring 81. Further, the solid-state image sensor IS6 may be configured such that the connected state and the disconnected state of the front gate unit 21FG of the amplifier transistor 21a and the front gate unit 21FG of the amplifier transistor 21a can be switched by a switch circuit (e.g., transistor).

Providing the plurality of amplifier transistors 21 connected in parallel as described above is equivalent to increasing the area of the amplifier transistor 21. As a result, the driving capability of the amplifier transistor 21 can be improved.

Further, by switching between the connected state and the disconnected state of the plurality of amplifier transistors 21, it is possible to increase the dynamic range for converting the analog pixel signal into the digital pixel signal. As a result, the conversion efficiency of AD-conversion of the pixel signal can be switched.

Further, since the solid-state image sensor IS6 according to this embodiment has a stacked structure of a pixel transistor similarly to the above-mentioned solid-state image sensor IS5 according to the fifth embodiment, effects similar to those of the above-mentioned solid-state image sensor IS5 according to the fifth embodiment can be achieved. Further, since the solid-state image sensor IS6 includes the amplifier transistor 21 having the same configuration as that of the amplifier transistor 21 provided in the above-mentioned solid-state image sensor IS1 according to the first embodiment, effects similar to those of the above-mentioned solid-state image sensor IS1 according to the first embodiment can be achieved.

Ninth Embodiment

A solid-state image sensor according to a ninth embodiment of the present technology will be described with reference to FIG. 34. Note that components exhibiting the same effects and functions as those of the above-mentioned solid-state image sensor IS1 according to the first embodiment are denoted by the same reference symbols, and description thereof is omitted.

Figure 34:
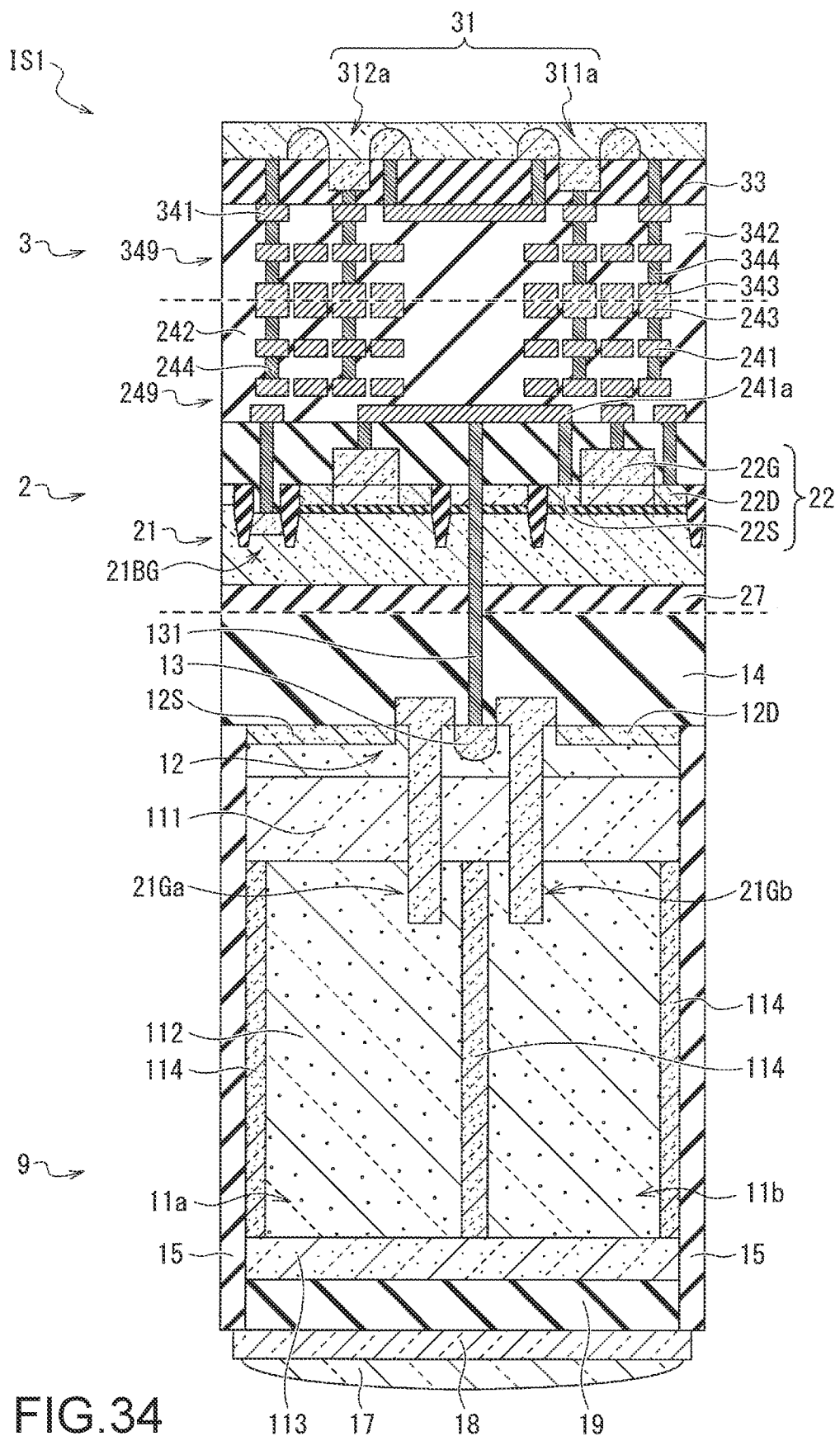
FIG. 34 is a diagram showing a circuit configuration example of one pixel of a solid-state image sensor according to a ninth embodiment of the present technology.

As shown in FIG. 34, a first substrate 9 provided in a solid-state image sensor IS7 according to this embodiment includes a plurality of (two in this embodiment) photoelectric conversion units 11a and 11b and a plurality of (two in this embodiment) transfer gate units 12Ga and 12Gb. That is, the solid-state image sensor IS7 has a shared pixel structure.

The solid-state image sensor IS7 includes the pixel transistor having the same configuration as that of the above-mentioned pixel transistor in the first embodiment while having the shared pixel structure. That is, the solid-state image sensor IS7 includes the amplifier transistor 21 provided with a back gate unit BG21. As a result, the solid-state image sensor IS7 is capable of achieving effects similar to those of the above-mentioned solid-state image sensor IS1 according to the first embodiment.

The present technology can be modified in various ways. For example, in the solid-state image sensor according to the first embodiment to the ninth embodiment, the amplifier transistor has a SOI structure, but may have a bulk-silicon structure.

The technology according to the present disclosure can be applied to the solid-state image sensor described above.

Note that the embodiment of the present technology is not limited to the embodiments described above, and various modifications can be made without departing from the essence of the present technology. Further, the effects described herein are merely illustrative and not restrictive, and may have other effects.

For example, the present technology may also take the following configurations.

(1) A solid-state image sensor, including:
a first substrate that includes a photoelectric conversion unit, a transfer gate unit that is connected to the photoelectric conversion unit, a floating diffusion unit that is connected to the transfer gate unit, and an insulating film that covers the photoelectric conversion unit, the transfer gate unit, and the floating diffusion unit; and
a second substrate that includes a first transistor and is disposed to be adjacent to the insulating film, the first transistor constituting a part of a circuit connected to the floating diffusion unit via the insulating film and including a back gate.

(2) The solid-state image sensor according to (1) above, in which
the first transistor has a SOI structure.

(3) The solid-state image sensor according to (1) or (2) above, in which
the first transistor includes a front gate connected to the back gate.

(4) The solid-state image sensor according to (3), in which
the back gate includes a back gate electrode and a back gate insulating film,
the front gate includes a front gate electrode and a front gate insulating film, and
the back gate insulating film and the front gate insulating film have different film types or different film structures.

(5) The solid-state image sensor according to (3), in which
the back gate includes a back gate electrode and a back gate insulating film,
the front gate includes a front gate electrode and a front gate insulating film, and
the back gate insulating film and the front gate insulating film have different film quality.

(6) The solid-state image sensor according to any one of (1) to (5) above, in which
the second substrate includes a switch unit connected to the back gate.

(7) The solid-state image sensor according to any one of (1) to (6) above, further including
a third substrate that is disposed to be adjacent to the second substrate, a comparator circuit being formed on the third substrate, the comparator circuit including a transistor that includes a back gate and has a SOI structure.

(8) The solid-state image sensor according to any one of (1) to (6) above, further including
a third substrate that is disposed to be adjacent to the second substrate, a comparator circuit being formed on the third substrate, the comparator circuit including a transistor that includes a back gate and has a bulk silicon structure.

(9) The solid-state image sensor according to any one of (1) to (8) above, in which
the second substrate includes
a second transistor constituting a part of the circuit, and
an interlayer insulating film formed between the first transistor and the second transistor.

(10) The solid-state image sensor according to (9) above, in which
the second substrate includes a plurality of the first transistors, and
front gates are provided to be connectable to each other in at least a part of the plurality of first transistors.

(11) The solid-state image sensor according to any one of (1) to (10) above, in which the first substrate includes a plurality of the photoelectric conversion units and a plurality of the transfer gate units.

REFERENCE SIGNS LIST 1, 9 first substrate
1α photoelectric conversion unit formation region
2 second substrate
2a SOI substrate
2α pixel transistor formation region
3 third substrate
3α logic circuit formation region
4, 5, 7, 8 second substrate
6 third substrate
11, 11a, 11b photoelectric conversion unit
11 photoelectric conversion unit
12 transfer transistor
12D, 21D, 22D, 23D, 31D, 51D, 61D drain unit
12FG front gate unit
12G, 12Ga, 12Gb transfer gate unit
12S, 21S, 22S, 23S, 31S, 51S, 61S source unit
13 FD unit
14, 26, 33, 71 interlayer insulating film
15 pixel separation unit
17 microlens
18 color filter
19 flattening film
21, 21a, 21b, 41 amplifier transistor
21BG, 61BG back gate unit
21Cb, 21Cd, 21Cf, 21Cs, 22Cd, 22Cg, 22Cs, 23Cg, 23Cs, 51Cd, 51Cg contact region
21FG, 61FG front gate unit
22 reset transistor
22G, 23G, 31G, 51G gate unit
23 selection transistor
24, 34 bonding electrode
25, 35 element separation region
27, 215, 242, 342 insulating film
30 constant current source
31, 61 comparator circuit
51 switch unit
249, 349 stacked unit
81, 131, 231, 232a, 234a, 234b, 241a, 331, 411, 631 connection wiring
111 well region
112 charge generation region
113 bottom-portion pinning layer
114 side-surface pinning layer
211b, 611b, 612b back gate electrode
211f, 611f, 612f front gate electrode
212b back gate insulating film
212f front gate insulating film 213, 613 silicon layer
214, 614 silicon substrate
216 oxide film
217 opening
221g, 231g, 511g gate electrode
241, 341 wiring electrode
243, 343 bonding electrode 244, 344 connection electrode
311a, 312a, 611a, 611c, 612a, 612b MOSFET
611 differential input circuit
612 current mirror circuit
615 tail current source
BG back gate
FD transfer gate unit
FD unit 13 transfer gate unit
FD unit 13 back gate electrode
FG front gate unit
FG21 front gate
FG61 front gate unit
IS, IS1, IS2, IS3, IS4, IS5, IS6, IS7 solid-state image sensor

The invention claimed is:

1. A solid-state image sensor, comprising:
a first substrate that includes a photoelectric conversion unit, a transfer gate unit that is connected to the photoelectric conversion unit, a floating diffusion unit that is connected to the transfer gate unit, and an insulating film that covers the photoelectric conversion unit, the transfer gate unit, and the floating diffusion unit; and
a second substrate that includes a first transistor which is adjacent to the insulating film, the first transistor constituting a part of a circuit connected to the floating diffusion unit via the insulating film and including a back gate, wherein
the first transistor includes a front gate connected to the back gate,
the back gate includes a back gate electrode and a back gate insulating film,
the front gate includes a front gate electrode and a front gate insulating film, and
the back gate insulating film and the front gate insulating film have different film types or different film structures.

2. The solid-state image sensor according to claim 1, wherein the first transistor has a SOI structure.

3. The solid-state image sensor according to claim 1, wherein
the back gate insulating film and the front gate insulating film have different film quality.

4. The solid-state image sensor according to claim 1, wherein
the second substrate includes a switch unit connected to the back gate.

5. The solid-state image sensor according to claim 1, further comprising
a third substrate which is adjacent to the second substrate, a comparator circuit on the third substrate, the comparator circuit including a transistor that includes a back gate and has a SOI structure.

6. The solid-state image sensor according to claim 1, further comprising
a third substrate which is adjacent to the second substrate, a comparator circuit on the third substrate, the comparator circuit including a transistor that includes a back gate and has a bulk silicon structure.

7. The solid-state image sensor according to claim 1, wherein
the second substrate includes
a second transistor constituting a part of the circuit, and
an interlayer insulating film between the first transistor and the second transistor.

8. The solid-state image sensor according to claim 7, wherein
the second substrate includes a plurality of first transistors, and
a plurality of front gates is connectable to each other in at least a part of the plurality of first transistors.

9. The solid-state image sensor according to claim 1, wherein the first substrate includes a plurality of photoelectric conversion units and a plurality of transfer gate units.

* * * * *